United States Patent
Suzuki et al.

(10) Patent No.: US 10,400,330 B2
(45) Date of Patent: Sep. 3, 2019

(54) TUNGSTEN FILM FORMING METHOD AND STORAGE MEDIUM

(71) Applicant: TOKYO ELECTRON LIMITED, Tokyo (JP)

(72) Inventors: Kenji Suzuki, Tokyo (JP); Takanobu Hotta, Nirasaki (JP); Tomohisa Maruyama, Nirasaki (JP); Masayuki Nasu, Nirasaki (JP); Junya Miyahara, Nirasaki (JP); Koji Maekawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/473,993

(22) Filed: Mar. 30, 2017

(65) Prior Publication Data
US 2017/0283942 A1    Oct. 5, 2017

(30) Foreign Application Priority Data
Apr. 4, 2016 (JP) .................. 2016-075061

(51) Int. Cl.
*H01L 21/285* (2006.01)
*H01L 21/768* (2006.01)
(Continued)

(52) U.S. Cl.
CPC .............. *C23C 16/08* (2013.01); *C23C 16/14* (2013.01); *C23C 16/45534* (2013.01);
(Continued)

(58) Field of Classification Search
CPC ......... C23C 16/00; C23C 16/06; C23C 16/08; C23C 16/14; C23C 16/22; C23C 16/52;
(Continued)

(56) References Cited

U.S. PATENT DOCUMENTS 9,330,936 B2 * 5/2016 Hasegawa ......... H01L 21/02381
9,536,745 B2 * 1/2017 Narushima ....... H01L 21/28556
(Continued)

FOREIGN PATENT DOCUMENTS

JP    2003-193233 A    7/2003
JP    2004-273764 A    9/2004
(Continued)

OTHER PUBLICATIONS

Ammerlaan, J.A.M., et al, "Chemical vapor deposition of tungsten by H2 reduction of WCl6", Applied Surface Science 53, 1991, pp. 24-29.

*Primary Examiner* — Maliheh Malek
(74) *Attorney, Agent, or Firm* — Nath, Goldberg & Meyer; Jerald L. Meyer

(57) ABSTRACT

There is provided a tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, which includes: performing an $SiH_4$ gas treatment with respect to the target substrate having the base film formed thereon by supplying an $SiH_4$ gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas.

18 Claims, 16 Drawing Sheets

(51) Int. Cl.
*C23C 16/14* (2006.01)
*C23C 16/08* (2006.01)
*C23C 16/455* (2006.01)
*H01L 21/3205* (2006.01)
*C23C 16/452* (2006.01)

(52) U.S. Cl.
CPC .. *C23C 16/45553* (2013.01); *H01L 21/28562* (2013.01); *H01L 21/28568* (2013.01); *H01L 21/32051* (2013.01); *H01L 21/76861* (2013.01); *H01L 21/76877* (2013.01)

(58) Field of Classification Search
CPC .............. C23C 16/277; C23C 16/0272; C23C 16/0281; C23C 16/4415; C23C 16/45536–16/45542; C23C 16/45525; C23C 16/45553; H01L 21/28556–21/28581; H01L 21/76841
See application file for complete search history.

(56) References Cited

U.S. PATENT DOCUMENTS

| | | | | |
|---|---|---|---|---|
| 9,536,782 | B2* | 1/2017 | Hotta | H01L 21/28556 |
| 9,640,404 | B2* | 5/2017 | Suzuki | H01L 21/76883 |
| 10,026,616 | B2* | 7/2018 | Suzuki | H01L 21/28556 |
| 2003/0108674 | A1* | 6/2003 | Chung | C23C 16/34 |
| | | | | 427/255.394 |
| 2013/0189854 | A1* | 7/2013 | Hausmann | H01L 21/0217 |
| | | | | 438/792 |
| 2013/0323859 | A1* | 12/2013 | Chen | C23C 16/52 |
| | | | | 438/7 |
| 2014/0120723 | A1* | 5/2014 | Fu | H01L 21/28506 |
| | | | | 438/680 |
| 2014/0154883 | A1* | 6/2014 | Humayun | H01L 21/67207 |
| | | | | 438/675 |
| 2014/0273452 | A1* | 9/2014 | Blomberg | H01L 21/28562 |
| | | | | 438/680 |
| 2015/0132939 | A1* | 5/2015 | Hasegawa | H01L 21/02381 |
| | | | | 438/602 |
| 2015/0279735 | A1* | 10/2015 | Hotta | H01L 21/28556 |
| | | | | 438/656 |
| 2015/0279736 | A1* | 10/2015 | Hotta | H01L 21/28556 |
| | | | | 438/660 |
| 2015/0325475 | A1* | 11/2015 | Bamnolker | C23C 16/045 |
| | | | | 438/680 |
| 2016/0040287 | A1* | 2/2016 | Akasaka | C23C 16/14 |
| | | | | 427/123 |
| 2016/0225632 | A1* | 8/2016 | Shaikh | H01L 21/033 |
| 2016/0233099 | A1* | 8/2016 | Narushima | H01L 21/28556 |
| 2016/0233220 | A1* | 8/2016 | Danek | H01L 27/10891 |
| 2016/0284553 | A1* | 9/2016 | Suzuki | H01L 21/76883 |
| 2016/0348234 | A1* | 12/2016 | Suzuki | C23C 16/045 |
| 2016/0351401 | A1* | 12/2016 | Ba | H01L 21/28556 |
| 2016/0351402 | A1* | 12/2016 | Suzuki | H01L 21/28556 |
| 2016/0351444 | A1* | 12/2016 | Schloss | H01L 21/76876 |
| 2016/0379879 | A1* | 12/2016 | Hotta | C23C 16/45527 |
| | | | | 438/656 |
| 2017/0117155 | A1* | 4/2017 | Bamnolker | H01L 21/28556 |
| 2017/0125538 | A1* | 5/2017 | Sharangpani | H01L 21/28556 |
| 2017/0350008 | A1* | 12/2017 | Collins | C23C 16/45525 |
| 2018/0053660 | A1* | 2/2018 | Jandl | H01L 21/28562 |
| 2018/0237911 | A1* | 8/2018 | Narushima | C23C 16/45527 |
| 2018/0312972 | A1* | 11/2018 | Maekawa | C23C 16/45525 |
| 2018/0315649 | A1* | 11/2018 | Maekawa | H01L 21/76868 |
| 2019/0088408 | A1* | 3/2019 | Morita | H01F 27/2804 |

FOREIGN PATENT DOCUMENTS

| | | |
|---|---|---|
| JP | 2006-28572 A | 2/2006 |
| KR | 10-2008-0101745 A | 11/2008 |
| KR | 10-2015-0074178 A | 7/2015 |

* cited by examiner

Before formation of tungsten film

Tensile stress

Directly forming tungsten film on base film

Compressive stress

SiH$_4$ gas treatment

Tensile stress

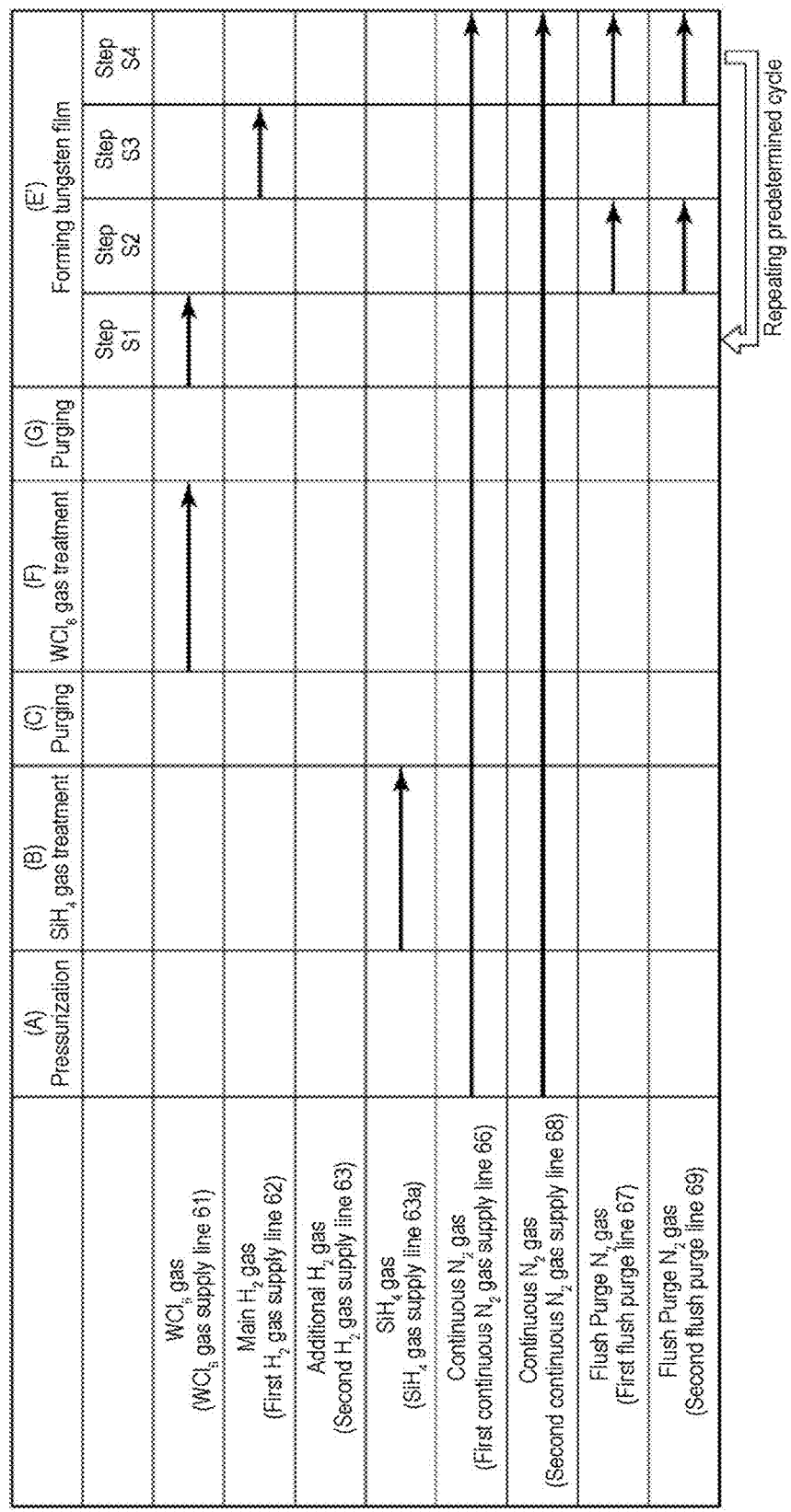

TUNGSTEN FILM FORMING METHOD AND STORAGE MEDIUM

CROSS-REFERENCE TO RELATED APPLICATION

This application claims the benefit of Japanese Patent Application No. 2016-075061, filed on Apr. 4, 2016, in the Japan Patent Office, the disclosure of which is incorporated herein in its entirety by reference.

TECHNICAL FIELD

The present disclosure relates to a tungsten film forming method and a non-transitory computer-readable storage medium.

BACKGROUND

When manufacturing an LSI, tungsten is widely used for a MOSFET gate electrode, a contact between a source and a drain, a word line of a memory and the like. Copper wiring is mainly used in a multilayer wiring process. However, copper is poor in heat resistance and is prone to diffuse. Thus, tungsten is used in a portion where a heat resistance is required or a portion where deterioration of electric characteristics due to copper diffusion is concerned.

A physical vapor deposition (PVD) method has been used as a tungsten film forming process in the past. However, it is difficult for the PVD method to cope with a portion where high coverage (step coverage) is required. Therefore, a film is formed by a chemical vapor deposition (CVD) method with good step coverage.

As a method of forming a tungsten film (CVD-tungsten film) by the CVD method, there is generally used a method of generating a reaction of $WF_6+3H_2 \rightarrow W+6HF$ on a semiconductor wafer as a target substrate, using, for example, a tungsten hexafluoride ($WF_6$) gas as a raw material gas and a $H_2$ gas as a reducing gas.

However, in the case of forming a tungsten film by CVD using a $WF_6$ gas, there has been a strong concern that fluorine included in $WF_6$ reduces a gate insulating film and deteriorates electric characteristics thereof, particularly in a gate electrode, a word line of a memory or the like of a semiconductor device.

Tungsten hexachloride ($WCl_6$) is known as a raw material gas for the formation of a CVD-W film not containing fluorine. Similar to fluorine, chlorine has a reducing property. However, the reactivity of chlorine is weaker than that of fluorine. It is expected that chlorine has a reduced adverse effect on electric characteristics.

Recently, the miniaturization of semiconductor devices is progressing. Even with CVD which is said to be capable of achieving good step coverage, it is difficult to perform the embedding into a complex shape pattern. From the viewpoint of obtaining even higher step coverage, attention is paid to an atomic layer deposition (ALD) method in which a raw material gas and a reducing gas are sequentially supplied while performing a purge process in the course of sequentially supplying the raw material gas and the reducing gas.

On the other hand, in the case of forming a tungsten film by CVD or ALD, the adhesion to an oxide film such as an interlayer insulating film or the like is poor and the incubation time is prolonged. Therefore, film formation is difficult. For this reason, a Ti-based material film such as a TiN film is used as a base film.

However, a tungsten chloride gas used as a tungsten raw material has a property of etching a material that constitutes a base film such as a TiN film. When forming a tungsten film, a base film such as a TiN film is etched. Thus, there is a possibility that the thickness of the tungsten film becomes smaller than a required film thickness.

SUMMARY

Some embodiments of the present disclosure provide a tungsten film forming method capable of forming a tungsten film while suppressing etching of a base film, using a tungsten chloride gas as a raw material gas, and a non-transitory computer-readable storage medium which stores the tungsten film forming method.

According to one embodiment of the present disclosure, there is provided a tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, which includes: performing an $SiH_4$ gas treatment with respect to the target substrate having the base film formed thereon by supplying an $SiH_4$ gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas.

According to another embodiment of the present disclosure, there is provided a tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, which includes: performing an $SiH_4$ gas treatment with respect to the target substrate having the base film formed thereon by supplying an $SiH_4$ gas into the chamber; subsequently, performing a tungsten chloride gas treatment with respect to the target substrate subjected to the $SiH_4$ gas treatment by supplying the tungsten chloride gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas.

According to yet another embodiment of the present disclosure, there is provided a tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, which includes: performing a $SiH_4$ gas treatment with respect to the target substrate having the base film formed thereon by supplying an $SiH_4$ gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas, wherein in the forming the tungsten film, the presence of the reducing gas is suppressed when supplying the tungsten chloride gas.

According to yet another embodiment of the present disclosure, there is provided a non-transitory computer-readable storage medium operating on a computer and storing a program for controlling a film forming apparatus, wherein the program, when executed, causes the computer to control the film forming apparatus so as to perform the aforementioned tungsten film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 20 is a view showing a specific sequence example in the second embodiment, in which case the added $H_2$ gas is not used during a tungsten film formation.

DETAILED DESCRIPTION

Embodiments of the present disclosure will now be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Example of Film Forming Apparatus>

Figure 1:
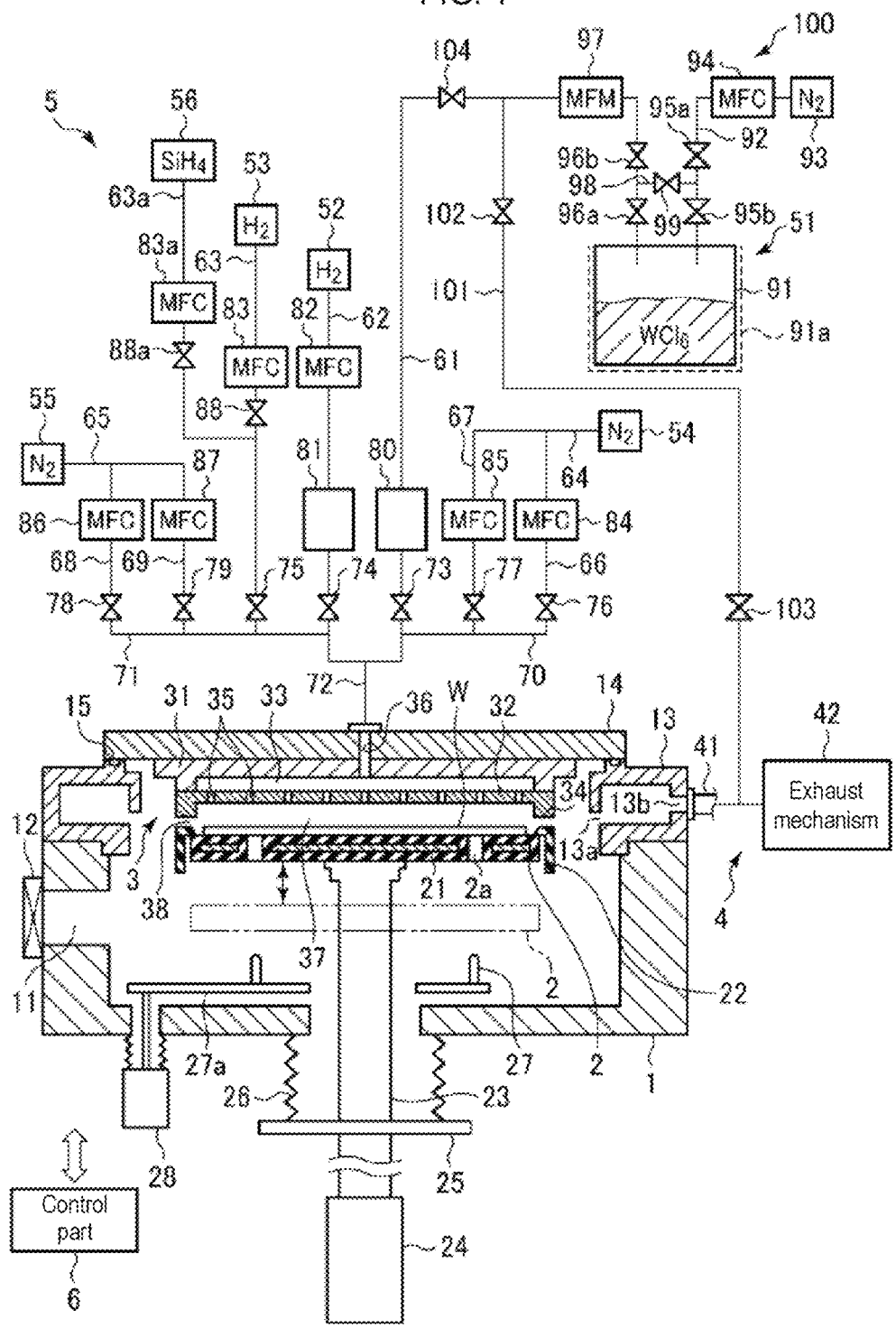
FIG. 1 is a sectional view showing one example of a film forming apparatus for implementing a tungsten film forming method according to the present disclosure.

FIG. 1 is a sectional view showing one example of a film forming apparatus for implementing a tungsten film forming method according to the present disclosure. This film forming apparatus is configured as an apparatus capable of operating in both an ALD film formation mode and a CVD film formation mode.

The film forming apparatus 100 includes a chamber 1, a susceptor 2 configured to horizontally support a semiconductor wafer (hereinafter simply referred to as a wafer) W as a target substrate in the chamber 1, a shower head 3 configured to supply a process gas into the chamber 1 in a shower-like manner, an exhaust part 4 configured to exhaust the interior of the chamber 1, a process gas supply mechanism 5 configured to supply a process gas to the shower head 3, and a control part 6.

The chamber 1 is made of metal such as aluminum or the like and has a substantially cylindrical shape. A loading/unloading gate 11 through which the wafer W is loaded and unloaded, is formed in a sidewall of the chamber 1. The loading/unloading gate 11 can be opened and closed by a gate valve 12. An annular exhaust duct 13 having a rectangular cross section is installed on a main body of the chamber 1. A slit 13a is formed in the exhaust duct 13 along an inner circumferential surface thereof. An exhaust port 13b is formed in the outer wall of the exhaust duct 13. A top wall 14 is installed on the upper surface of the exhaust duct 13 so as to close an upper opening of the chamber 1. A gap between the top wall 14 and the exhaust duct 13 is hermetically sealed with a seal ring 15.

The susceptor 2 has a disk shape having a size corresponding to the wafer W and is supported by a support member 23. The susceptor 2 is made of a ceramic material such as aluminum nitride (AlN) or the like, or a metallic material such as aluminum, nickel-based alloy or the like. A heater 21 for heating the wafer W is embedded in the susceptor 2. The heater 21 is configured to generate heat using electric power supplied from a heater power supply (not shown). The wafer W is controlled to have a predetermined temperature by controlling the output of the heater 21 in response to a temperature signal of a thermocouple (not shown) installed on the upper surface of the susceptor 2 in the vicinity of a wafer mounting surface.

In the susceptor 2, a cover member 22 made of ceramic such as alumina or the like is installed so as to cover an outer peripheral region of the wafer mounting surface and a side surface of the susceptor 2.

The support member 23 supporting the susceptor 2 extends from the center of the bottom surface of the susceptor 2 to the lower side of the chamber 1 through a hole formed in the bottom wall of the chamber 1. A lower end of the support member 23 is connected to an elevator mechanism 24. The susceptor 2 can be moved up and down by the elevator mechanism 24 via the support member 23 between a process position shown in FIG. 1 and a transfer position indicated by a one-dot chain line, in which the wafer W can be transferred. A collar portion 25 is attached to the support member 23 at a position below the chamber 1. A bellows 26 configured to isolate an internal atmosphere of the chamber 1 from the ambient air and configured to expand and contract along with the ascending and descending operations of the susceptor 2 is installed between the bottom surface of the chamber 1 and the collar portion 25.

Three wafer support pins 27 (only two are shown) are installed in the vicinity of the bottom surface of the chamber 1 so as to protrude upward from a lift plate 27a. The wafer support pins 27 can be moved up and down via the lift plate 27a by the elevator mechanism 28 installed below the chamber 1. The wafer support pins 27 are inserted into through-holes 2a formed in the susceptor 2 located at the transfer position so as to be able to protrude and retract with respect to the upper surface of the susceptor 2. By moving the wafer support pins 27 up and down in this manner, the wafer W is transferred between a wafer transfer mechanism (not shown) and the susceptor 2.

The shower head 3 is made of metal and is installed so as to face the susceptor 2. The shower head 3 has substantially the same diameter as the susceptor 2. The shower head 3 includes a main body portion 31 fixed to the top wall 14 of the chamber 1 and a shower plate 32 connected to the lower surface of the main body portion 31. A gas diffusion space 33 is formed between the main body portion 31 and the shower plate 32. A gas introduction hole 36 formed so as to penetrate the main body portion 31 and the center of the top wall 14 of the chamber 1 is connected to the gas diffusion space 33. An annular protrusion 34 protruding downward is formed in the peripheral edge portion of the shower plate 32. Gas discharge holes 35 are formed in the flat surface of the shower plate 32 existing on the inner side of the annular protrusion 34.

When the susceptor 2 is located at the process position, a process space 37 is formed between the shower plate 32 and the susceptor 2. The annular protrusion 34 and the upper surface of the cover member 22 of the susceptor 2 come close to form an annular gap 38.

The exhaust part 4 includes an exhaust pipe 41 connected to the exhaust port 13b of the exhaust duct 13 and an exhaust mechanism 42 connected to the exhaust pipe 41 and installed with a vacuum pump, a pressure control valve and the like. During the process, the gas existing in the chamber 1 is moved to the exhaust duct 13 via the slit 13a and is exhausted from the exhaust duct 13 through the exhaust pipe 41 by the exhaust mechanism 42 of the exhaust part 4.

The process gas supply mechanism 5 includes a $WCl_6$ gas supply mechanism 51 configured to supply a $WCl_6$ gas as a tungsten chloride gas which is a tungsten raw material gas, a first $H_2$ gas supply source 52 configured to supply a $H_2$ gas as a main reducing gas, a second $H_2$ gas supply source 52 configured to supply a $H_2$ gas as an additional reducing gas, a first $N_2$ gas supply source 54 configured to supply a $N_2$ gas as a purge gas, a second $N_2$ gas supply source 55, and an $SiH_4$ gas supply source 56. The process gas supply mechanism 5 further includes a $WCl_6$ gas supply line 61 extending from the $WCl_6$ gas supply source 51, a first $H_2$ gas supply line 62 extending from the first $H_2$ gas supply source 52, a second $H_2$ gas supply line 63 extending from the second $H_2$ gas supply source 53, a first $N_2$ gas supply line 64 extending from the first $N_2$ gas supply source 54 so as to supply a $N_2$ gas toward the $WCl_6$ gas supply line 61, a second $N_2$ gas supply line 64 extending from the second $N_2$ gas supply source 55 so as to supply a $N_2$ gas toward the first $H_2$ gas supply line 62, and a $SiH_4$ gas supply line 63a extending from the $SiH_4$ gas supply source 56 so as to be connected to the second $H_2$ gas supply line 63.

The first $N_2$ gas supply line 64 is branched into a first continuous $N_2$ gas supply line 66 configured to constantly supply a $N_2$ gas during a film forming process based on an ALD method and a first flush purge line 67 configured to supply a $N_2$ gas only in a purge process. The second $N_2$ gas supply line 65 is branched into a second continuous $N_2$ gas supply line 68 configured to constantly supply a $N_2$ gas during the film forming process based on an ALD method and a second flush purge line 69 configured to supply a $N_2$ gas only in a purge process. The first continuous $N_2$ gas supply line 66 and the first flush purge line 67 are connected to a first connection line 70. The first connection line 70 is connected to the $WCl_6$ gas supply line 61. Furthermore, the second $H_2$ gas supply line 63, the second continuous $N_2$ gas supply line 68 and the second flush purge line 69 are connected to a second connection line 71. The second connection line 71 is connected to the first $H_2$ gas supply line 62. The $WCl_6$ gas supply line 61 and the first $H_2$ gas supply line 62 are joined in a joint pipe 72. The joint pipe 72 is connected to the above-described gas introduction hole 36.

At the most downstream side of the $WCl_6$ gas supply line 61, the first $H_2$ gas supply line 62, the second $H_2$ gas supply line 63, the first continuous $N_2$ gas supply line 66, the first flush purge line 67, the second continuous $N_2$ gas supply line 68 and the second flush purge line 69, there are respectively installed opening/closing valves 73, 74, 75, 76, 77, 78 and 79 for switching gases at the time of ALD. At the upstream side of the opening/closing valves in the first $H_2$ gas supply line 62, the second $H_2$ gas supply line 63, the first continuous $N_2$ gas supply line 66, the first flush purge line 67, the second continuous $N_2$ gas supply line 68 and the second flush purge line 69, there are respectively installed mass flow controllers 82, 83, 84, 85, 86 and 87 as flow rate controllers. The mass flow controller 83 is installed at the upstream side of a junction point joined with the $SiH_4$ gas supply line 63a in the second $H_2$ gas supply line 63. An opening/closing valve 88 is installed between the mass flow controller 83 and the junction point of the $SiH_4$ gas supply line 63a. In the $SiH_4$ gas supply line 63a, a mass flow controller 83a and an opening/closing valve 88a are installed sequentially from the upstream side. Therefore, either or both of a $H_2$ gas and a $SiH_4$ gas can be supplied via the second $H_2$ gas supply line 63. In the $WCl_6$ gas supply line 61 and the first $H_2$ gas supply line 62, buffer tanks 80 and 81 are respectively installed so that necessary gas can be supplied in a short period of time.

The $WCl_6$ gas supply mechanism 51 includes a film-forming material tank 91 configured to contain $WCl_6$. $WCl_6$ is a solid at room temperature. Thus, $WCl_6$ in a solid phase is contained in the film-forming material tank 91. A heater 91a is installed around the film-forming material tank 91. The heater 91a is configured to heat a film-forming material contained in the film-forming material tank 91 to an appropriate temperature, thereby sublimating $WCl_6$. The above-described $WCl_6$ gas supply line 61 is inserted into the film-forming material tank 91 from above.

The $WCl_6$ gas supply mechanism 51 includes a carrier gas pipe 92 inserted into the film-forming material tank 91 from above, a carrier $N_2$ gas supply source 93 configured to supply a $N_2$ gas as a carrier gas to the carrier gas pipe 92, a mass flow controller 94 as a flow rate controller connected to the carrier gas pipe 92, opening/closing valves 95a and 95b installed at the downstream side of the mass flow controller 94, opening/closing valves 96a and 96b installed in the vicinity of the film-forming material tank 91 in the WCl$_6$ gas supply line 61, and a flow meter 97. In the carrier gas pipe 92, the opening/closing valve 95a is installed at a position directly below the mass flow controller 94, and the opening/closing valve 95b is installed at the insertion end side of the carrier gas pipe 92. In addition, the opening/closing valves 96a and 96b and the flow meter 97 are disposed in the order of the opening/closing valve 96a, the opening/closing valve 96b and the flow meter 97 from the insertion end of the WCl$_6$ gas supply line 61.

A bypass pipe 98 is installed so as to connect a position between the opening/closing valve 95a and the opening/closing valve 95b of the carrier gas pipe 92 and a position between the opening/closing valve 96a and the opening/closing valve 96b of the WCl$_6$ gas supply line 61. An opening/closing valve 99 is installed in the bypass pipe 98. By closing the opening/closing valves 95b and 96a and opening the opening/closing valves 99, 95a and 96b, an N$_2$ gas can be supplied from the carrier N$_2$ gas supply source 93 to the WCl$_6$ gas supply line 61 through the carrier gas pipe 92 and the bypass pipe 98, thereby purging the WCl$_6$ gas supply line 61.

One end of an Evac (registered trademark) pipe 101 is connected to the downstream position of the flow meter 97 in the WCl$_6$ gas supply line 61, and the other end of the Evac pipe 101 is connected to the exhaust pipe 41. In the Evac pipe 101, opening/closing valves 102 and 103 are installed in the vicinity of the WCl$_6$ gas supply line 61 and the exhaust pipe 41, respectively. An opening/closing valve 104 is installed in at the downstream side of a connection position between the Evac pipe 101 and the WCl$_6$ gas supply line 61. By opening the opening/closing valves 102, 103, 96a and 96b with the opening/closing 104, 99, 95a and 95b closed, it is possible to evacuate the interior of the film-forming material tank 91 by the exhaust mechanism 42.

The control part 6 includes a process controller including a microprocessor (computer) configured to control respective components, specifically, the valves, the power supply, the heater, the pump and the like, a user interface, and a memory part. The respective components of the film forming apparatus 100 are electrically connected to and controlled by the process controller. The user interface is connected to the process controller and is composed of a keyboard which enables an operator to perform an input operation of commands in order to manage the respective components of the film forming apparatus 100, a display which visually displays the operation status of the respective components of the film forming apparatus 100, and the like. The memory part is also connected to the process controller. The memory part stores a control program for realizing various processes executed by the film forming apparatus 100 under the control of the process controller, a control program, namely a process recipe, for causing the respective components of the film forming apparatus 100 to execute predetermined processes according to processing conditions, various databases, and the like. The process recipe is stored in a storage medium (not shown) in the memory part. The storage medium may be a fixed storage medium such as a hard disk or the like, or may be a portable storage medium such as a CD ROM, a DVD, a semiconductor memory or the like. Alternatively, a recipe may be appropriately transmitted from another device via, e.g., a dedicated line. If necessary, a predetermined process recipe is called out from the memory part in response to an instruction from the user interface and is executed by the process controller such that a desired process is performed in the film forming apparatus 100 under the control of the process controller.

<Film Forming Method>

Next, an embodiment of a tungsten film forming method performed by the film forming apparatus 100 configured as above will be described.

[First Embodiment]

First, a first embodiment of the film forming method will be described.

Figure 2:
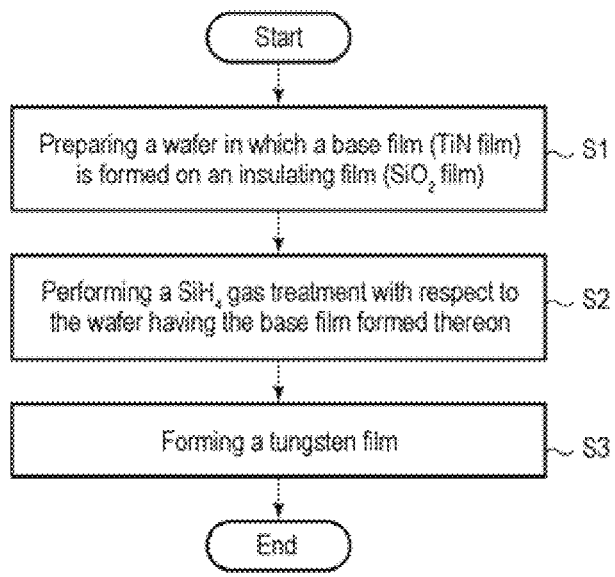
FIG. 2 is a flowchart showing a tungsten film forming method according to a first embodiment of the present disclosure.
Figure 3A:
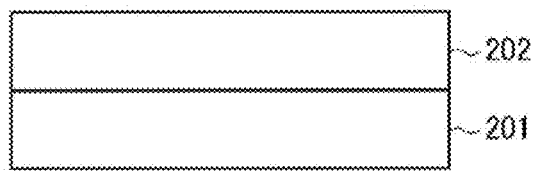
FIGS. 3A, 3B and 3C are sectional views schematically showing steps of the tungsten film forming method according to the first embodiment of the present disclosure.
Figure 3B:
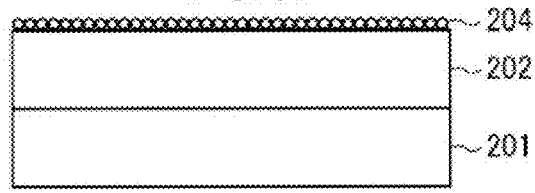
Figure 3C:
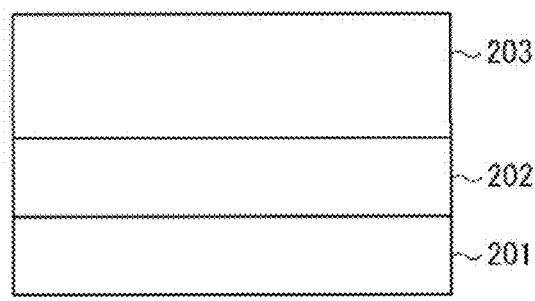

FIG. 2 is a flowchart showing a tungsten film forming method according to a first embodiment of the present disclosure. FIGS. 3A, 3B and 3C are sectional views schematically showing steps of the tungsten film forming method according to the first embodiment of the present disclosure.

First, as shown in FIG. 3A, a wafer W is provided on which a base film 202 is formed on an insulating film 201 such as a SiO$_2$ film or the like (step S1). For the sake of convenience, the insulating film 201 and the base film 202 are drawn in a planar shape. However, in reality, concave portions having a fine complicated shape are formed in the insulating film 201. The base film 202 is formed along such concave portions.

Examples of the base film 202 may include a titanium-based material film such as a TiN film, a TiSiN film, a Ti silicide film, a Ti film, a TiON film, a TiAlN film, or the like. Examples of the base film 202 may include a tungsten-based compound film such as a WN film, a WSi$_x$ film, a WSiN film or the like. By forming the base film 202 on the insulating film 201, a tungsten film can be formed with good adhesion.

Next, as shown in FIG. 3B, a SiH$_4$ gas treatment is performed with respect to the wafer W on which the base film 202 is formed (step S2).

This treatment is a treatment for suppressing the reaction between the WCl$_6$ gas used as a tungsten chloride gas and the base film 202 when forming a tungsten film. Thus, a SiH$_4$ gas 204 is adsorbed onto the surface of the base film 202.

After the SiH$_4$ gas treatment, as shown in FIG. 3C, a tungsten film is formed on the base film 202 using a WCl$_6$ gas as a tungsten chloride gas and a H$_2$ gas as a reducing gas (step S3).

In order to obtain good step coverage, a tungsten film 203 is formed according to an ALD method or a sequence similar thereto by sequentially supplying the WCl$_6$ gas and the H$_2$ gas while purging the interior of the chamber 1 in the course of sequentially supplying the WCl$_6$ gas and the H$_2$ gas.

In the present embodiment, as described above, the SiH$_4$ gas treatment is performed on the surface of the base film 202 prior to forming the tungsten film 203 in step S3. This is for the following reasons.

In the case where the base film 202 is a TiN film, if the WCl$_6$ gas is supplied in a state in which almost no tungsten film is formed, an etching reaction represented by the following formula (1) occurs between the TiN film and the WCl$_6$ gas.

$$\text{TiN (s)} + \text{WCl}_6 \text{(g)} \rightarrow \text{TiCl}_4 \text{(g)} + \text{WCl}_x\text{(g)} \quad (1)$$

As a supply time and a flow rate of the WCl$_6$ gas increase, an etched amount of the TiN film becomes larger.

Therefore, as a result of studying a method of suppressing such an etching reaction between the TiN film and the WCl$_6$ gas, it was found that it is effective to perform a treatment with a gas having higher activity than WCl$_6$ and having no etching action against TiN or the like and to cause such a gas to be adsorbed onto the surface of the TiN film. As a result of evaluating a plurality of gases, a SiH$_4$ gas was found to be effective. That is to say, by causing a highly active $SiH_4$ gas to be adsorbed onto the base film 202 composed of a TiN film or the like, when the $WCl_6$ gas is supplied in order to form the tungsten film, it is possible to suppress the etching reaction of the TiN film used as the base film 202 by the $WCl_6$ gas.

Figure 4:
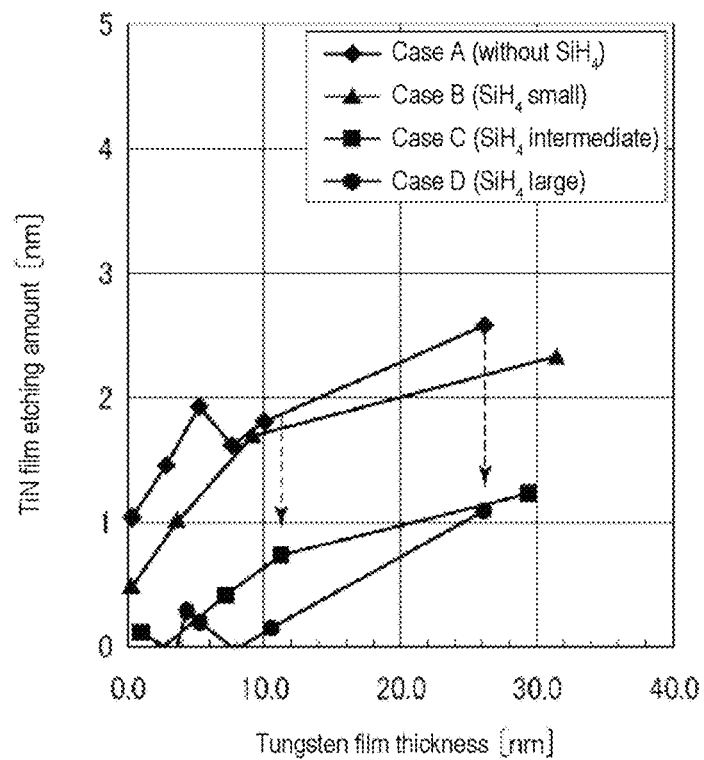
FIG. 4 is a view showing the result of confirming a base film etching suppressing effect in the first embodiment.

FIG. 4 is a view showing the relationship between a film thickness of a tungsten film and an etched amount of a TiN film for case A in which the tungsten film is formed by an ALD method using a $WCl_6$ gas and an $H_2$ gas without supplying an $SiH_4$ gas onto the TiN film and for cases B, C and D in which the tungsten film is similarly formed by the ALD method after supplying the $SiH_4$ gas. For cases B to D, a flow rate of the $SiH_4$ gas is changed. The flow rate of the $SiH_4$ gas is smallest ($SiH_4$ small) in case B. The flow rate of the $SiH_4$ gas is largest ($SiH_4$ large) in case D. The flow rate of the $SiH_4$ gas is intermediate ($SiH_4$ intermediate) in case C.

It can be seen from FIG. 4 that the etching of the TiN film can be suppressed by performing the $SiH_4$ gas treatment prior to forming the tungsten film and further that the etching suppressing effect increases as the flow rate of the $SiH_4$ gas grows larger.

By performing the $SiH_4$ gas treatment prior to forming the tungsten film, in addition to the effect of suppressing the etching of the base film 202 by the $WCl_6$ gas, it is possible to obtain (1) an effect of reducing a resistance of the tungsten film 203 formed on the base film 202 and (2) an effect of suppressing line collapse caused by line distortion when the tungsten film is formed in a line-and-space manner.

Regarding the effect of (1), it is presumed that the $SiH_4$ gas adsorbed onto the base film 202 has a function of canceling crystallinity of the base film 202. That is to say, the TiN film used as the base film 202 forms a columnar crystal in which crystal phases are oriented in the vertical direction. When the tungsten film is formed directly on the TiN film, tungsten grows by dragging the crystal orientation of the TiN film. Thus, a crystal grain size of the tungsten film becomes small and the tungsten film has a high resistance. On the other hand, by allowing the $SiH_4$ gas to be absorbed onto the TiN film, the tungsten film formed on the TiN film does not drag the crystal orientation of the TiN film. Thus, it is possible to increase the crystal grain size, whereby the resistance becomes low.

Figure 5:
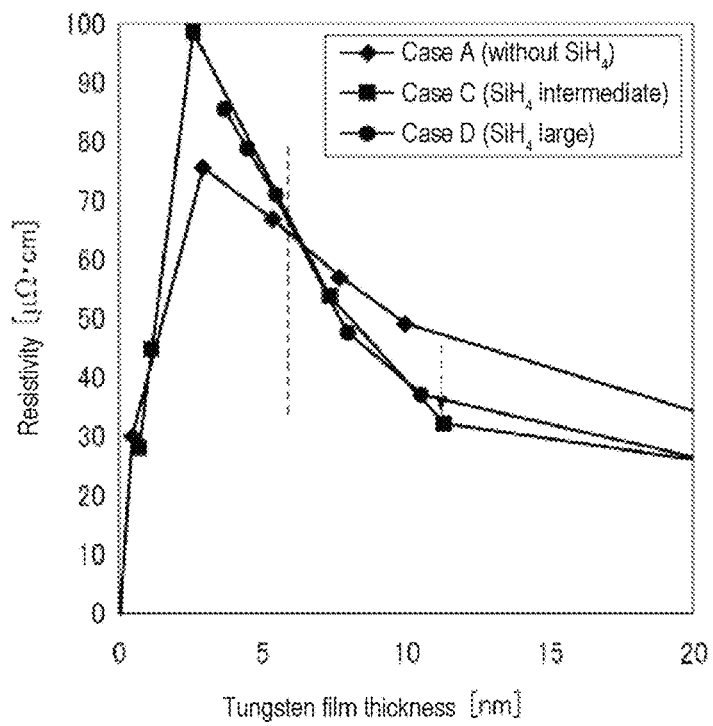
FIG. 5 is a view showing the result of confirming a resistivity reduction effect in the first embodiment.

FIG. 5 is a view showing the relationship between a thickness of a tungsten film and a resistivity of the tungsten film for the aforementioned case A (without $SiH_4$ gas supply), the aforementioned case C (with $SiH_4$ supply (intermediate flow rate)), and the aforementioned case D (with $SiH_4$ supply (large flow rate)). It can be seen from FIG. 5 that by performing the $SiH_4$ gas treatment prior to forming the tungsten film, the resistivity is reduced by 30 to 40% when the film thickness of the tungsten film is 10 nm or more.

Figure 6:
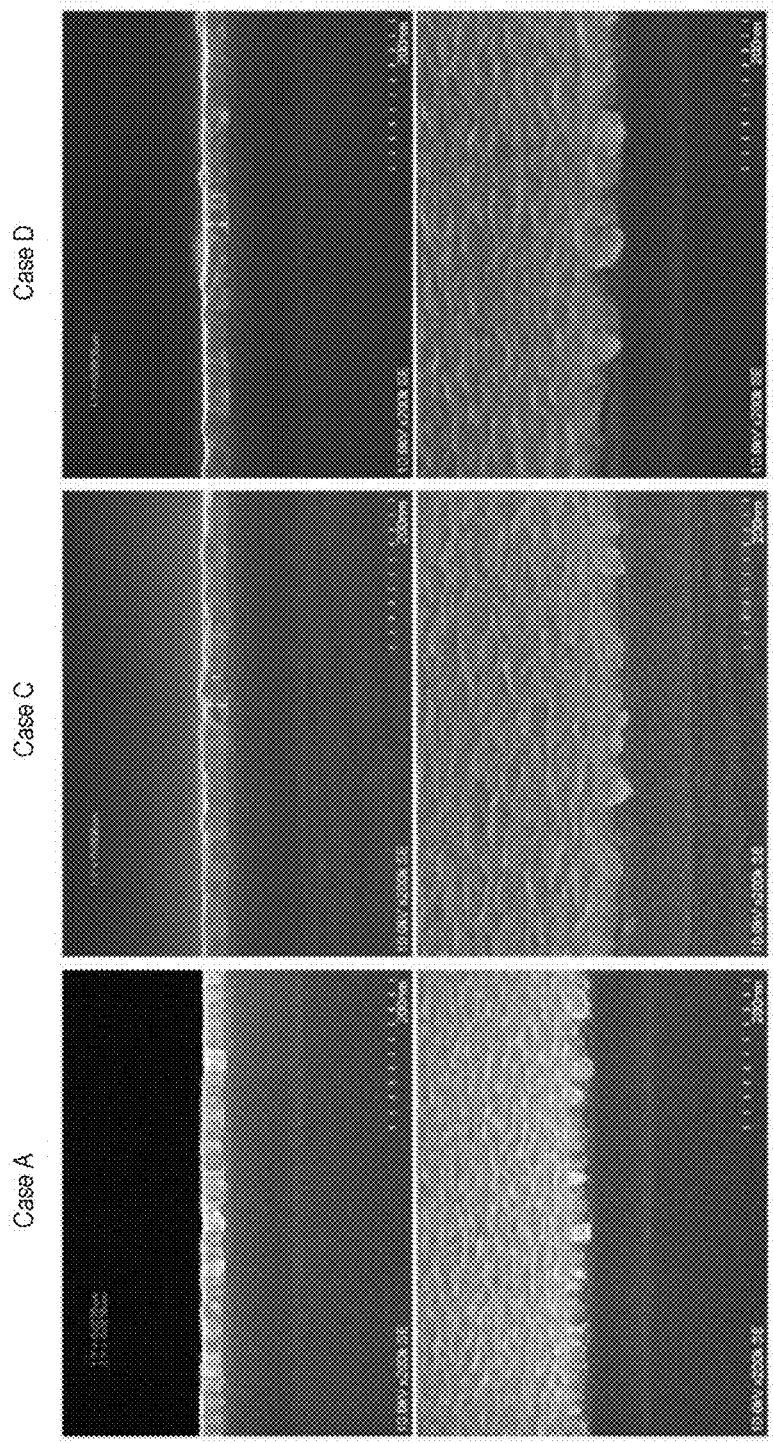
FIG. 6 shows SEM photographs which indicate the result of confirming an effect of increasing the crystal grain size of a tungsten film in the first embodiment.

FIG. 6 shows SEM photographs of the cross section and the surface in these cases A, C and D when the film thickness of the tungsten film is about 30 nm. It can be noted that the crystal grain size of the tungsten film formed on the TiN film is increased by allowing the $SiH_4$ gas to be adsorbed onto the TiN film.

As for the effect of (2), the stress of the tungsten film formed without the $SiH_4$ gas treatment is a compressive stress, whereas the stress of the tungsten film becomes a tensile stress by performing the $SiH_4$ gas treatment.

Figure 7A:
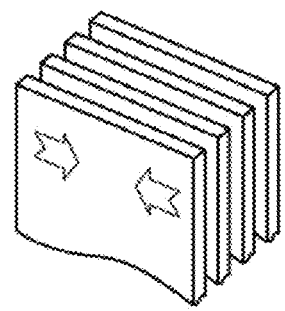
FIGS. 7A, 7B and 7C are views for explaining a line collapse suppression mechanism in the first embodiment.
Figure 7B:
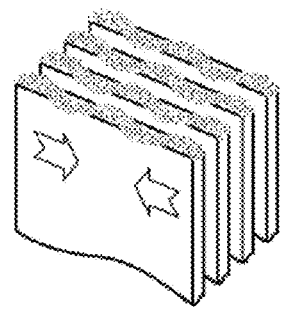
Figure 7C:
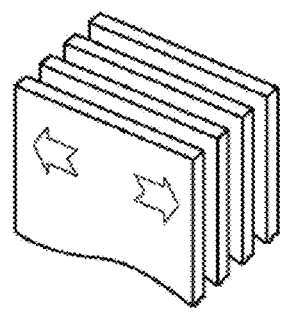

This point will be explained with reference to FIGS. 7A, 7B and 7C. A tensile stress is generated in the wafer before the tungsten film is formed (FIG. 7A). When the tungsten film is directly formed on the TiN film, a compressive stress is generated in the tungsten film. If distortion is generated in the line, the stress of the tungsten film becomes a compressive stress. Thus, line collapse is likely to occur due to the line distortion (FIG. 7B). On the other hand, a tensile stress is generated in the tungsten film formed after the $SiH_4$ gas treatment, wherein the tensile stress is equal to that before the formation of the tungsten film. Therefore, distortion is not generated in the line (FIG. 7C).

The $SiH_4$ gas treatment may be performed at a wafer temperature of 300 degrees C. or higher and at an internal pressure of the chamber of 3 to 50 Torr (400 to 6,665 Pa). At this time, an inert gas such as a $N_2$ gas or the like may be supplied together with the $SiH_4$ gas. In that case, a partial pressure of the $SiH_4$ gas may be 0.1 to 3.0 Torr (13.3 to 400 Pa).

The formation of the tungsten film 203 may be performed at a wafer temperature of 300 degrees C. or higher and at an internal pressure of the chamber of 5 to 100 Torr (666.5 to 13,330 Pa). A partial pressure of the $WCl_6$ gas may be 0.5 to 10 Torr (66.7 to 1,333 Pa).

Figure 8:
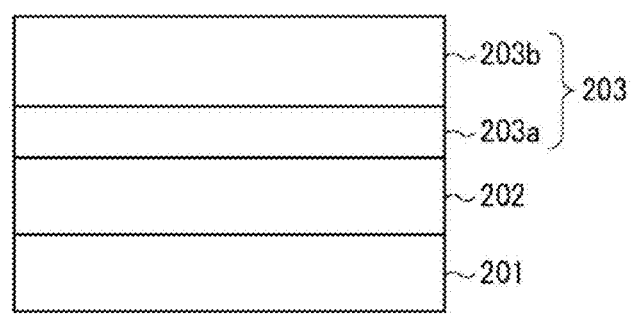
FIG. 8 is a view showing an example in which a tungsten film is formed in two stages in the first embodiment.

The formation of the tungsten film 203 may be performed under the same conditions until a required film thickness is obtained. Alternatively, as shown in FIG. 8, a film forming process may be performed at two stages in such a way that a first tungsten film 203a is formed in a state in which a supply amount of the $WCl_6$ gas is kept relatively small at an initial stage of the film forming process and subsequently, a second tungsten film 203b as a main film is formed in a state in which the supply amount of the $WCl_6$ gas is raised to the required amount. As a result, the supply amount of the $WCl_6$ gas is small at the initial stage of the film forming process. Thus, the etched amount of the base film 202 remains small. Furthermore, the first tungsten film 203a serves as a barrier of the $WCl_6$ gas with respect to the base film 202 when the second tungsten film 203b is formed at a large supply amount of the $WCl_6$ gas. It is therefore possible to effectively suppress the etching of the base film 202.

At this time, the second tungsten film 203b is formed by an ALD method or a sequential supply method similar thereto in order to obtain good embedability (step coverage). However, the first tungsten film 203b is intended to effectively suppress the etching of the base film 202. Therefore, it is not necessary to consider the embedability too much. The film forming method may be either an ALD method or a CVD method. In any case, from the viewpoint of suppressing the etching of the base film 202, the partial pressure of the $WCl_6$ gas at the time of forming the first tungsten film 203a may be 1 Torr (133.3 Pa) or less, specifically 0.1 Torr (13.33 Pa) or less. In some embodiments, at the time of forming the first tungsten film 203a, the supply amount of the $WCl_6$ gas may be ramped up from the smallest amount to a predetermined amount at the initial stage of the film forming process. If the thickness of the first tungsten film 203a is too small, the effect thereof becomes small. If the thickness of the first tungsten film 203a is too large, the embedability is deteriorated. Thus, the thickness of the first tungsten film 203a may fall within a range of about 1 to 10 nm. In addition, the first tungsten film 203 a may be formed as multistage films while changing the supply amount of the $WCl_6$.

While $WCl_6$ has been described to be used as the tungsten chloride used for forming the tungsten film 203, $WCl_5$ and $WCl_4$ may be used in addition to $WCl_6$. These $WCl_5$ and $WCl_4$ also show almost the same behavior as $WCl_6$.

The reducing gas is not limited to the $H_2$ gas, but may be any reducing gas containing hydrogen. In addition to the $H_2$ gas, an $SiH_4$ gas, a $B_2H_6$ gas, an $NH_3$ gas, or the like may be used as a reducing gas. Two or more of the $H_2$ gas, the $SiH_4$ gas, the $B_2H_6$ gas and the $NH_3$ gas may be supplied. Reducing gases other than these gases, for example, a $PH_3$ gas and an $SiH_2Cl_2$ gas may be used. In some embodiments, from the viewpoint of further reducing impurities in the film to obtain a low resistance value, the $H_2$ gas may be used.

As the purge gas and the carrier gas, it may be possible to use an inert gas such as an $N_2$ gas, an Ar gas or the like.

Next, a specific sequence of the first embodiment will be described. First, the gate valve 12 is opened in a state in which the susceptor 2 is moved down to the transfer position. The wafer W in which the base film 202 is formed on the insulating film 201 as shown in FIG. 3A is loaded into the chamber 1 through the loading/unloading gate 11 by a transfer device (not shown) and is placed on the susceptor 2 heated to a predetermined temperature by the heater 21. The susceptor 2 is moved up to the process position. The interior of the chamber 1 is evacuated to a predetermined vacuum level. The opening/closing valves 104, 95a, 95b and 99 are closed, and the opening/closing valves 102, 103, 96a and 96b are opened. The interior of the film-forming material tank 91 is similarly evacuated via the Evac pipe 101.

Figure 9:
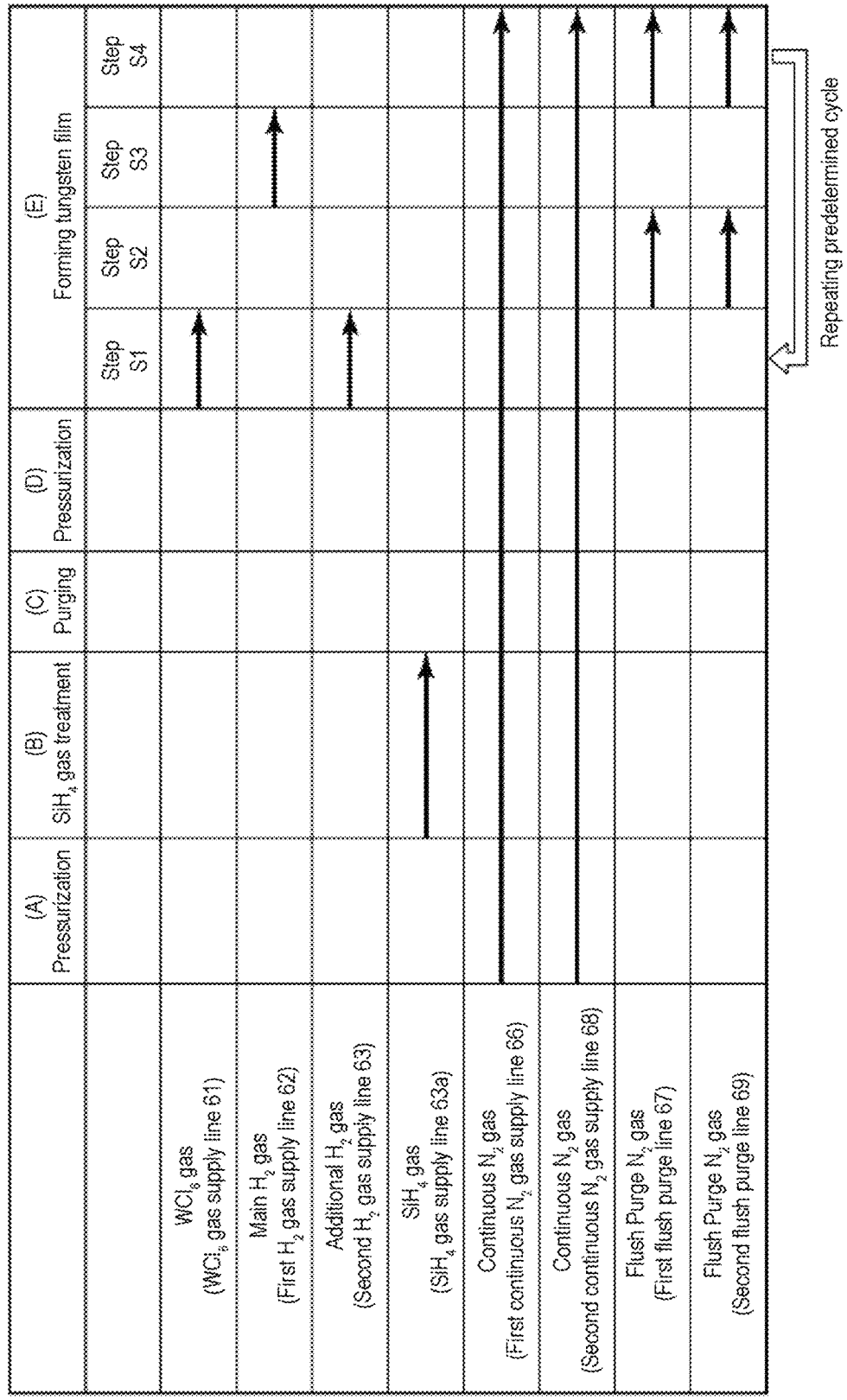
FIG. 9 is a view showing a specific sequence example in the first embodiment.

In this state, the tungsten film forming method of the present embodiment is performed according to a gas supply sequence as illustrated in FIG. 9.

The opening/closing valves 76 and 78 are opened and the opening/closing valves 73, 74, 75, 77 and 79 are closed. The $N_2$ gas is supplied from the first $N_2$ gas supply source 54 and the second $N_2$ gas supply source 55 into the chamber 1 via the first continuous $N_2$ gas supply line 66 and the second continuous $N_2$ gas supply line 68, thereby raising an internal pressure of the chamber 1 and stabilizing the temperature of the wafer W placed on the susceptor 2 ((A) raise in pressure). After the internal pressure of the chamber 1 reaches a predetermined pressure, the opening/closing valves 102 and 103 are closed and the opening/closing valves 104, 95a and 95b are opened to raise an internal pressure of the film-forming material tank 91.

In this state, while keeping the opening/closing valves 76 and 78 opened, the $N_2$ gas is continuously supplied from the first $N_2$ gas supply source 54 and the second $N_2$ gas supply source 55 through the first continuous $N_2$ gas supply line 66 and the second continuous $N_2$ gas supply line 68. By opening the opening/closing valves 88a and 75, the $SiH_4$ gas is supplied from the $SiH_4$ gas supply source 56 into a process space defined inside the chamber 1 via the $SiH_4$ supply pipe 63a and the second $H_2$ gas supply line 63, thereby allowing the $SiH_4$ gas to be adsorbed onto the surface of the wafer W ((B) $SiH_4$ gas treatment).

Thereafter, the opening/closing valves 88a and 75 are closed to stop the supply of the $SiH_4$ gas. The interior of the chamber 1 is evacuated and the $N_2$ gas is continuously supplied from the first continuous $N_2$ gas supply line 66 and the second continuous $N_2$ gas supply line 68, thereby purging the interior of the chamber 1 ((C) purging).

Thereafter, while supplying the $N_2$ gas into the chamber 1, the internal pressure of the chamber 1 is raised ((D) raise in pressure). Then, the $WCl_6$ gas as a film-forming raw material gas, the $H_2$ gas as a reducing gas, and the $N_2$ as a purge gas are supplied in a sequential manner as described below, thereby forming a tungsten film ((E) tungsten film formation).

First, while keeping the opening/closing valves 76 and 78 opened, the $N_2$ gas is continuously supplied from the first $N_2$ gas supply source 54 and the second $N_2$ gas supply source 55 via the first continuous $N_2$ gas supply line 66 and the second continuous $N_2$ gas supply line 68. By opening the opening/closing valves 73, 75 and 88, the $WCl_6$ gas is supplied from the $WCl_6$ gas supply mechanism 51 into the process space 37 in the chamber 1 via the $WCl_6$ gas supply line 61, and the $H_2$ gas (additional $H_2$ gas) as an additional reducing gas is supplied into the chamber 1 via the second $H_2$ gas supply line 63 extending from the second $H_2$ gas supply source 53 (step S1). At this time, the $WCl_6$ gas is temporarily retained in the buffer tank 80 and is then supplied into the chamber 1.

In step S1, $WCl_6$ is adsorbed onto the surface of the wafer W. At this time, $WCl_6$ is activated due to the presence of $H_2$ added at the same time.

Subsequently, while continuously supplying the $N_2$ gas via the first continuous $N_2$ gas supply line 66 and the second continuous $N_2$ gas supply line 68, the opening/closing valves 73 and 75 are closed to stop the supply of the $WCl_6$ gas and the $H_2$ gas, and the opening/closing valves 77 and 79 are opened to supply the $N_2$ gas (flush purge $N_2$ gas) from the first flush purge line 67 and the second flush purge line 69. The surplus $WCl_6$ and the like existing in the process space 37 are purged by the large flow rate of $N_2$ gas (step S2).

Thereafter, the opening/closing valves 77 and 79 are closed to stop the supply of the $N_2$ gas from the first flush purge line 67 and the second flush purge line 69. While continuously supplying the $N_2$ gas via the first continuous $N_2$ gas supply line 66 and the second continuous $N_2$ gas supply line 68, the opening/closing valve 74 is opened to supply the $H_2$ gas (main $H_2$ gas) as a main reducing gas from the first $H_2$ gas supply source 52 into the process space 37 via the first $H_2$ gas supply line 62 (step S3). At this time, the $H_2$ gas is temporarily retained in the buffer tank 81 and is then supplied into the chamber 1.

In step S3, $WCl_6$ adsorbed onto the wafer W is reduced. At this time, a flow rate of the main $H_2$ gas is set to an amount enough to cause a reducing reaction. The main $H_2$ gas is supplied at a flow rate larger than the flow rate of the additional $H_2$ gas supplied in step S1.

Subsequently, while continuously supplying the $N_2$ gas via the first continuous $N_2$ gas supply line 66 and the second continuous $N_2$ gas supply line 68, the opening/closing valve 74 is closed to stop the supply of the $H_2$ gas from the first $H_2$ gas supply line 62, and the opening/closing valves 77 and 79 are opened to supply the $N_2$ gas (flush purge $N_2$ gas) from the first flush purge line 67 and the second flush purge line 69. As in step S2, the surplus $H_2$ gas existing in the process space 37 is purged by the large flow rate of $N_2$ gas (step S4).

By carrying out the above steps S1 to S4 one cycle within a short period of time, a thin tungsten unit film is formed. The cycle of these steps is repeated a plurality of times to form the tungsten film 203 having a desired film thickness. At this time, the tungsten film 203 may be obtained by forming the first tungsten film 203a with a small supply amount of the $WCl_6$ gas and then forming the second tungsten film 203b with a large supply amount of the $WCl_6$ gas. The film thickness of the tungsten film 203 may be controlled by the number of repetitions of the aforementioned cycle.

By supplying the additional reducing gas from the second $H_2$ gas supply line 63 together with the $WCl_6$ gas to activate the $WCl_6$ gas in step S1, it is easy for the film-forming reaction in subsequent step S3 to occur. This makes it possible to increase a film thickness deposited per one cycle and to increase a film deposition rate. At this time, a supply amount of the $H_2$ gas needs to be set at such a level that an ALD reaction can be maintained by suppressing a CVD reaction. As an example, the supply amount of the $H_2$ gas may be 100 to 500 sccm (mL/min). The additional $H_2$ gas coming from the second $H_2$ gas supply line 63 may be constantly supplied during the period of steps S1 to S4. By doing so, the additional $H_2$ gas as an additional reducing gas is supplied at the time of supplying the $WCl_6$ gas. This makes it possible to activate the $WCl_6$ gas. At this time, the supply amount of the $H_2$ gas may be 10 to 500 sccm (mL/min) from the viewpoint of suppressing the CVD reaction and maintaining the ALD reaction. However, if the film-forming reaction occurs satisfactorily even under the absence of the additional $H_2$ gas, the additional $H_2$ gas may not be supplied.

After completing the (E) tungsten film formation as described above, the internal pressure of the chamber 1 is made equal to an external pressure. The gate valve 12 is opened and the processed wafer W is unloaded from the chamber 1 by a transfer device (not shown).

In the sequence described above, during the period of steps S1 to S4, while constantly supplying the $N_2$ gas as a purge gas from the first continuous $N_2$ gas supply line 66 and the second continuous $N_2$ gas supply line 68 to the $WCl_6$ gas supply line 61 and the first $H_2$ gas supply line 62, the $WCl_6$ gas and the $H_2$ gas are intermittently supplied in steps S1 and S3. It is therefore possible to improve the replacement efficiency of the gas existing in the process space 37. Furthermore, the $N_2$ gas is added from the first flush purge line 67 and the second flush purge line 69 at the time of purging the process space 37 in steps S2 and S4. It is therefore possible to further improve the gas replacement efficiency in the process space 37. This makes it possible to improve the film thickness controllability of the tungsten unit film.

In the film forming apparatus shown in FIG. 1, the buffer tanks 80 and 81 are respectively installed in the $WCl_6$ gas supply line 61 and the first $H_2$ gas supply line 62. Thus, it becomes easy to supply the $WCl_6$ gas and the $H_2$ gas in a short period of time. Even when one cycle is short, the required amount of $WCl_6$ gas and $H_2$ gas can be easily supplied in steps S1 and S3.

In the case of forming the tungsten film 203 at two stages as described above, the film forming process may be performed by a CVD method at the first stage. In that case, the supply of the $WCl_6$ gas from the $WCl_6$ gas supply pipe 61 and the supply of the $H_2$ gas from the first $H_2$ gas supply line 62 may be performed at the same time.

<Processing Conditions>

Examples of processing conditions are described below.

(1) $SiH_4$ Gas Treatment
  Pressure: 3 to 50 Torr (400 to 6,665 Pa)
  Temperature: 300 degrees C. or higher (specifically 450 to 600 degrees C.)
  $SiH_4$ gas flow rate: 50 to 200 sccm (mL/min)
  Flow rate of continuously supplied $N_2$ gas: 500 to 5,000 sccm (mL/min)

(2) Formation of Tungsten Film 203
  Pressure: 5 to 100 Torr (666.5 to 13,330 Pa)
  Temperature: 300 degrees C. or higher (specifically 450 to 600 degrees C.)
  Flow rate of $WCl_6$ gas: 3 to 60 sccm (mL/min)
  (Flow rate of carrier gas: 100 to 2000 sccm (mL/min)
  Partial pressure of $WCl_6$ gas: 0.5 to 10 Torr (66.7 to 1333 Pa)
  Flow rate of main $H_2$ gas: 2,000 to 8,000 sccm (mL/min)
  Flow rate of additional $H_2$ gas (described above): 100 to 500 sccm (mL/min)
  Flow rate of continuously supplied $N_2$ gas: 100 to 500 sccm (mL/min)
  (First and second continuous $N_2$ gas supply lines 66 and 68)
  Flow rate of flush purge $N_2$ gas: 500 to 3,000 sccm (mL/min)
  (First and second flush purge lines 67 and 69)
  Time period of step S1 (per one cycle): 0.01 to 5 sec
  Time period of step S3 (per one cycle): 0.1 to 5 sec
  Time period of steps S2 and S4 (purging) (per one cycle): 0.1 to 5 sec
  Supply time period of additional $H_2$ gas in step S1 (per one cycle): 0.01 to 0.3 sec
  Heating temperature of film-forming material tank: 130 to 170 degrees C.

[Second Embodiment]

Next, a second embodiment of the film forming method will be described.

Figure 10:
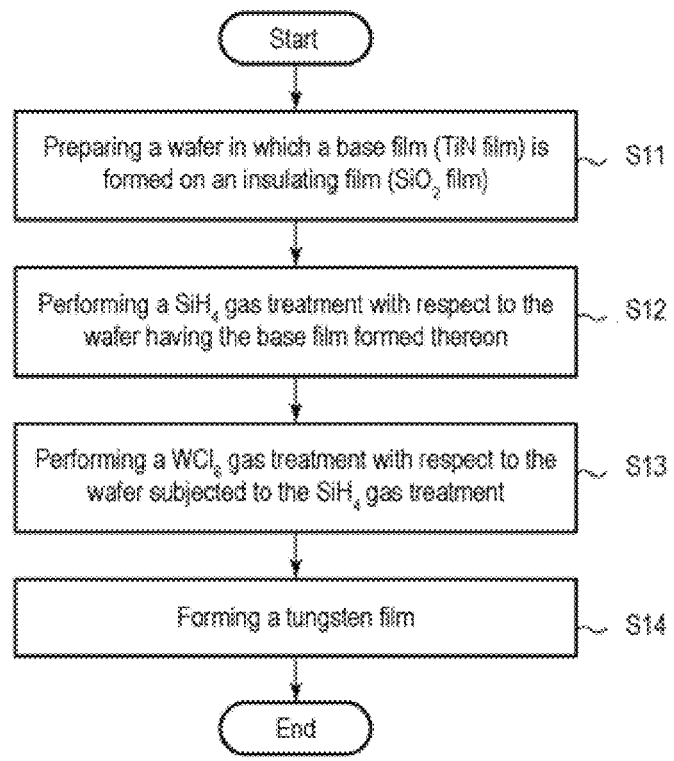
FIG. 10 is a flowchart showing a tungsten film forming method according to a second embodiment of the present disclosure.

FIG. 10 is a flowchart showing a tungsten film forming method according to a second embodiment of the present disclosure. FIGS. 11A, 11B, 11C and 11D are sectional views schematically showing steps of the tungsten film forming method according to the second embodiment of the present disclosure.

Figure 11A:
FIGS. 11A, 11B, 11C and 11D are sectional views schematically showing steps of the tungsten film forming method according to the second embodiment of the present disclosure.

In the present embodiment, as shown in FIG. 11A, similar to the first embodiment, a wafer W is initially provided in which a base film 202 is formed on an insulating film 201 such as a $SiO_2$ film or the like (step S11).

Figure 11B:
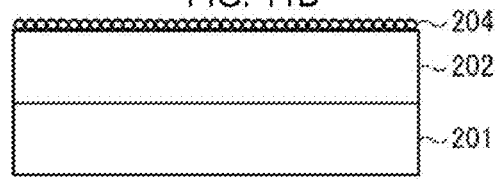

Subsequently, as shown in FIG. 11B, similar to the first embodiment, the wafer W on which the base film 202 is formed is subjected to a $SiH_4$ gas treatment (step S12). As a result, the $SiH_4$ gas 204 is adsorbed onto the surface of the base film 202.

Figure 11C:
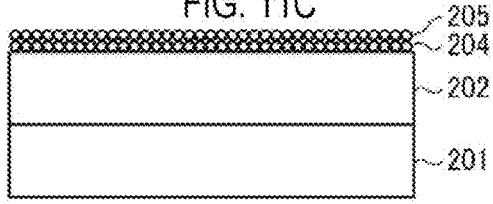

After the $SiH_4$ gas treatment, as shown in FIG. 11C, prior to forming a tungsten film, the wafer W is subjected to a treatment of a $WCl_6$ gas which is a tungsten chloride gas (step S13). As a result, a $WCl_6$ gas 205 is adsorbed onto the $SiH_4$ gas 204 which was adsorbed onto the surface of the base film 202 by the $SiH_4$ gas treatment.

This treatment is to lower the surface activity of the wafer W after the $SiH_4$ gas treatment. In this treatment, only the $WCl_6$ gas is supplied without supplying a reducing gas.

Figure 11D:
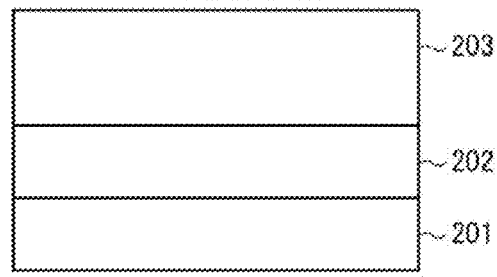

After the $WCl_6$ gas treatment, as shown in FIG. 11D, a tungsten film 203 is formed on the base film 202 using the $WCl_6$ gas as a tungsten chloride gas and the $H_2$ gas as a reducing gas (step S14).

Even in the present embodiment, in order to obtain good step coverage, the tungsten film 203 is formed according to an ALD method or a sequence similar thereto by sequentially supplying the $WCl_6$ gas and the $H_2$ gas while purging the interior of the chamber 1 in the course of sequentially supplying the $WCl_6$ gas and the $H_2$ gas.

In the present embodiment, as described above, the $WCl_6$ gas treatment is performed after the $SiH_4$ gas treatment in step S12 and before the formation of the tungsten film 203 in step S14. This is for the following reasons.

By carrying out the $SiH_4$ gas treatment, the $SiH_4$ gas is adsorbed onto the surface of the base film 202 so that the surface activity increases. This makes it possible to suppress the etching reaction of the base film 202 by the $WCl_6$ gas. However, in the case of a fine pattern, there may be a case where the embedability is not sufficient due to the high surface activity.

Figure 12:
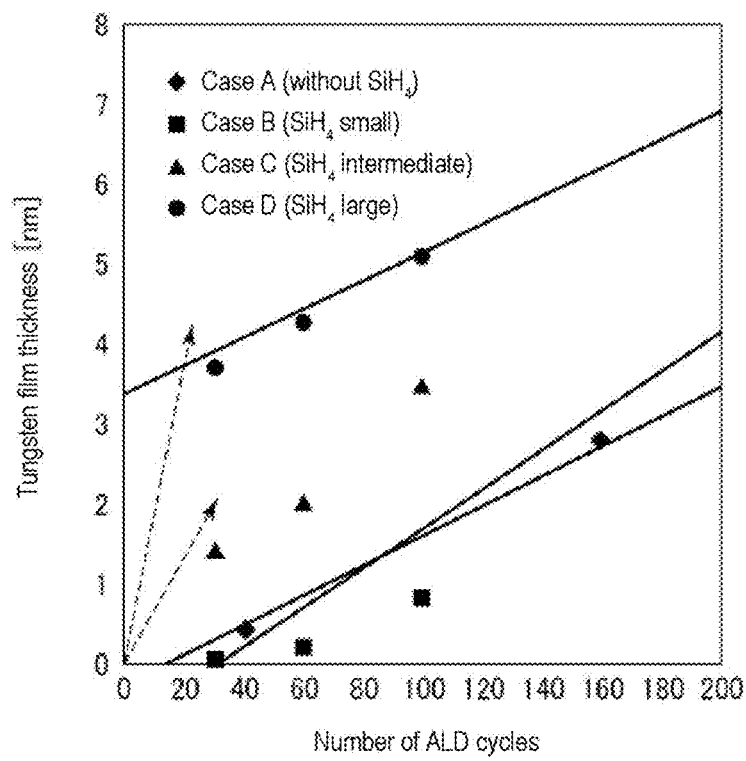
FIG. 12 is a view showing the relationship between the number of ALD cycles and the thickness of a tungsten film at the time of forming a tungsten film, in a case where a $SiH_4$ gas is supplied onto a TiN film and in a case where the $SiH_4$ gas is not supplied.

Similar to FIG. 4, FIG. 12 is a view showing the relationship between the number of cycles of ALD and a thickness of a tungsten film for case A in which the tungsten film is formed by an ALD method using a $WCl_6$ gas and an $H_2$ gas without supplying an $SiH_4$ gas onto a TiN film and for cases B, C and D in which the tungsten film is similarly formed by an ALD method after supplying the $SiH_4$ gas. As shown in FIG. 12, it can be noted that in case C where the flow rate of the SiH$_4$ gas is intermediate and in case D where the flow rate of the SiH$_4$ gas is large, the film thickness of the tungsten film becomes larger from the initial stage of the film forming process.

Figure 13:
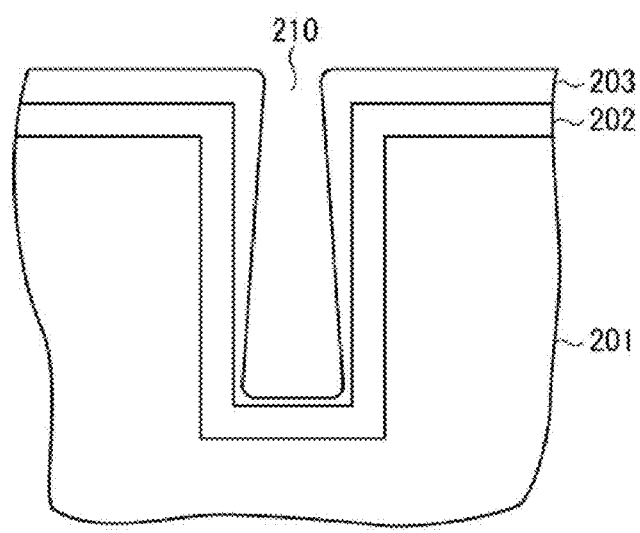
FIG. 13 is a sectional view showing the embedability when a $SiH_4$ gas is supplied onto a TiN film.

In the case where the film thickness of the tungsten film is increased from the initial stage of the film forming process as in cases C and D, as shown in FIG. 13, the tungsten film 203 is deposited thick in the entrance of a fine recess 210 such as a trench or hole. As such, the film thickness at the bottom of the fine recess 210 becomes thin and the embedability deteriorates.

Figure 14:
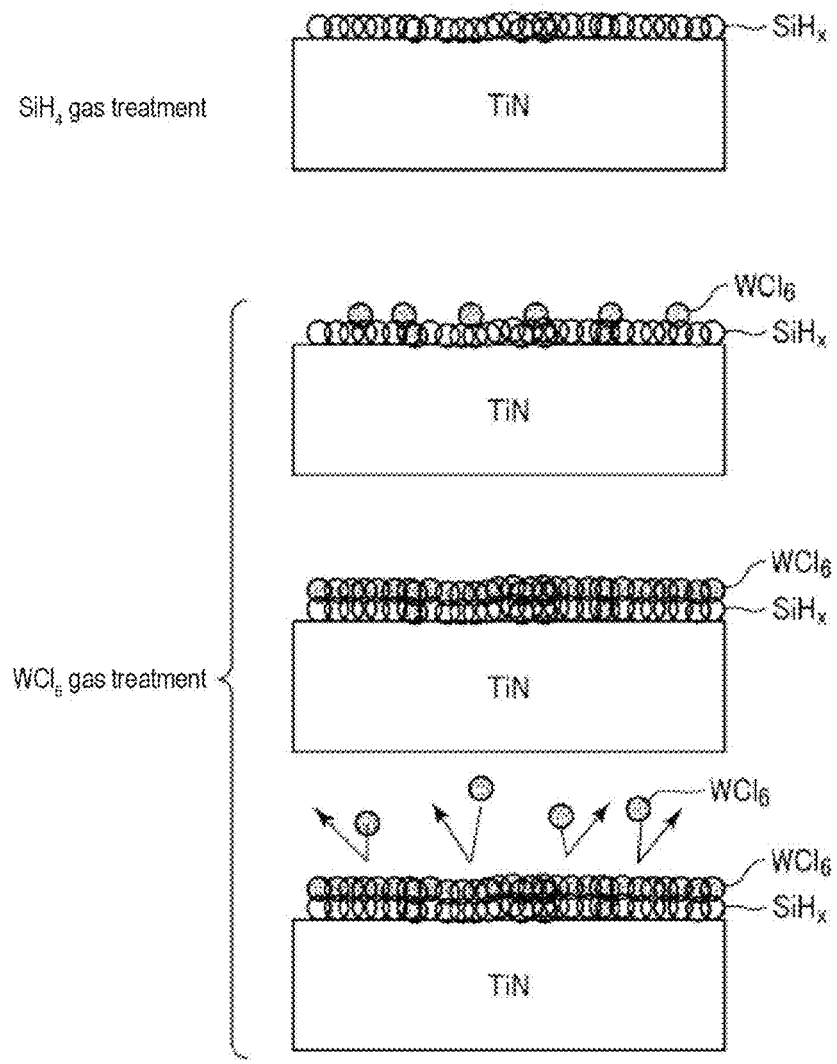
FIG. 14 is a view for explaining a mechanism when performing a $WCl_6$ gas treatment after a $SiH_4$ gas treatment in the second embodiment.

Therefore, in the present embodiment, by supplying only the WCl$_6$ gas to the surface of the base film 202 onto which the SiH$_4$ gas is adsorbed, SiH$_4$ and WCl$_6$ are caused to react with each other, thereby lowering the surface activity of the base film 202. This reaction is a reaction for forming tungsten on the basis of the following formulae (2) and (3). As shown in FIG. 14, the SiH$_4$ gas treatment is performed to cause SiH$_4$ (SiH$_x$) to be adsorbed onto the TiN film which is a base film. Even when the WCl$_6$ gas treatment is performed subsequently, if the tungsten film is formed in one layer (about 1 nm (1.5 nm or less)), the reaction is saturated (self-limited) and the tungsten film does not grow any more. As the adsorbed Si site is terminated with Cl species, the surface activity decreases.

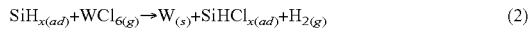

$$\text{SiH}_{x(ad)} + \text{WCl}_{6(g)} \rightarrow \text{W}_{(s)} + \text{SiHCl}_{x(ad)} + \text{H}_{2(g)} \quad (2)$$

$$\text{SiHCl}_{x(ad)} + \text{WCl}_{6(g)} \rightarrow \text{W}_{(s)} \quad (3)$$

Figure 15:
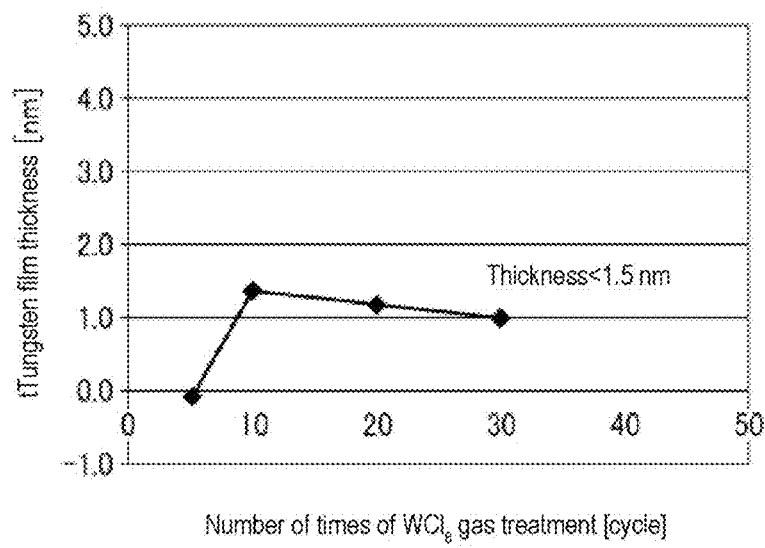
FIG. 15 is a view showing a change in film thickness of a tungsten film when a $WCl_6$ gas treatment is performed after a $SiH_4$ gas treatment.

This point is shown in FIG. 15. FIG. 15 is a view showing the relationship between the number of supply times of WCl$_6$ (corresponding to the number of cycles of ALD) and a film thickness of the tungsten film in the case where, after performing the SiH$_4$ gas treatment (the flow rate of the SiH$_4$ gas is the same as case D in FIG. 4), as the WCl$_6$ gas treatment, the WCl$_6$ gas is supplied in the form excluding the supply of H$_2$ gas at the time of forming the tungsten film by ALD. It can be seen from FIG. 15 that the film thickness of the tungsten film does not exceed 1.5 nm even if the number of tungsten supply times is increased.

Figure 16:
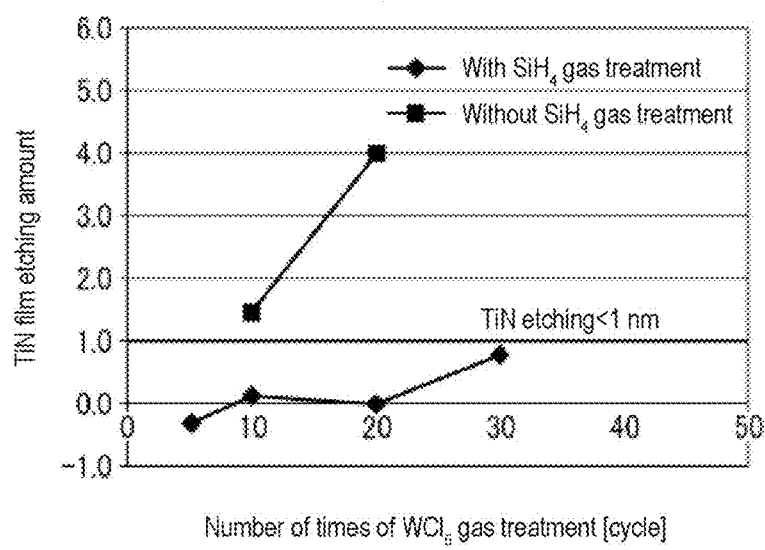
FIG. 16 is a view showing a base film etching suppressing effect in the second embodiment.

It is concerned that the base film is etched by performing the WCl$_6$ gas treatment. However, as shown in FIG. 16, by performing the WCl$_6$ gas treatment after the SiH$_4$ gas treatment, the etched amount of the base film (TiN Film) can be made smaller than 1 nm.

In this way, by performing the WCl$_6$ gas treatment in addition to the SiH$_4$ gas treatment, it is possible to reduce the surface activity of the base film 202. In reality, when only the SiH$_4$ gas treatment is performed, the initial deposition rate at the time of forming the tungsten film by the subsequent ALD was 0.12 nm/cycle. In contrast, when the WCl$_6$ gas treatment is performed after the SiH$_4$ gas treatment, the initial deposition rate at the time of forming the tungsten film by the subsequent ALD was 0.09 nm/cycle. Thus, it was found that the initial deposition rate is reduced.

In the second embodiment, the SiH$_4$ gas treatment and the formation of the tungsten film may be performed in the same manner as in the first embodiment.

In some embodiments, the WCl$_6$ gas treatment may be performed at a wafer temperature of 300 degrees C. or higher and at an internal pressure of the chamber of 5 to 50 Torr (666.5 to 6,665 Pa). In addition, a time period of the WCl$_6$ gas treatment may be equal to or longer than a time period to reach saturation (self-limit). The time period of the WCl$_6$ gas treatment varies depending on the flow rate of the WCl$_6$ gas and may be, for example, about 10 to 30 sec. The supply of the WCl$_6$ gas may be performed continuously and may be performed in a pulsed form. Examples of the pulsed form may include a form excluding the supply of the H$_2$ gas at the time of forming the tungsten film by ALD. By supplying the WCl$_6$ gas in the pulsed form, the WCl$_6$ gas can be caused to mildly react with the SiH$_4$ gas (SiH$_x$ gas) adsorbed onto the surface of the base film by the SiH$_4$ gas treatment.

In the meantime, by performing the WCl$_6$ gas treatment after the SiH$_4$ gas treatment, the initial deposition rate decreases. However, in some cases, it is required to further improve the embedability by lowering the initial deposition rate.

Therefore, studies were conducted to lower the initial deposition rate. As a result, it was found that by merely performing the WCl$_6$ gas treatment after the SiH$_4$ gas treatment, it is impossible to sufficiently maintain the reduction of the surface activity at the time of forming the tungsten film by ALD. It was also found that other approaches to maintaining the reduction of the surface activity are needed in order to further lower the initial deposition rate.

That is to say, at the initial stage of formation of the tungsten film by ALD, in addition to formulae (2) and (3) similar to the reaction at the time of the WCl$_6$ gas treatment as shown below, there is generated a reaction represented by formula (4) in which SiHCl$_x$ reacts with the H$_2$ gas as a reducing gas and returns to SiH$_x$. It is therefore impossible to maintain the reduction of the surface activity. In addition, formula (5) represents a tungsten formation reaction at the stationary stage.

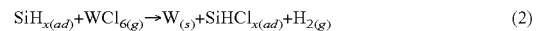

$$\text{SiH}_{x(ad)} + \text{WCl}_{6(g)} \rightarrow \text{W}_{(s)} + \text{SiHCl}_{x(ad)} + \text{H}_{2(g)} \quad (2)$$

$$\text{SiHCl}_{x(ad)} + \text{WCl}_{6(g)} \rightarrow \text{W}_{(s)} \quad (3)$$

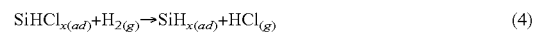

$$\text{SiHCl}_{x(ad)} + \text{H}_{2(g)} \rightarrow \text{SiH}_{x(ad)} + \text{HCl}_{(g)} \quad (4)$$

$$\text{WCl}_{6(g)} + \text{H}_{2(g)} \rightarrow \text{W}_{(s)} + \text{HCl}_{(g)} \quad (5)$$

In order to maintain the reduction of the surface activity at the initial stage of formation of the tungsten film by ALD, when supplying the WCl$_6$ gas, it is effective to suppress the presence of the H$_2$ gas as a reducing gas as much as possible, thereby suppressing the reaction of formula (4). For that purpose, it is effective to reduce the residual gas of the H$_2$ gas as much as possible when supplying the WCl$_6$ gas. However, it is most effective to stop the supply of the additional H$_2$ gas supplied at the time of supplying the WCl$_6$ gas.

Figure 17:
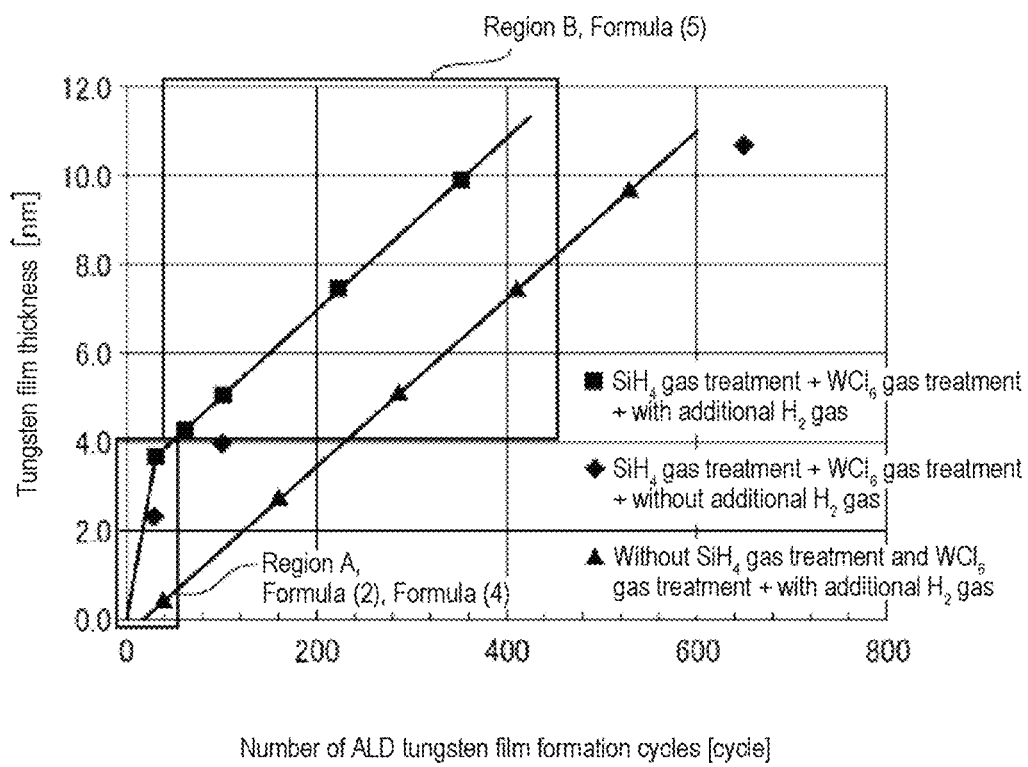
FIG. 17 is a view showing the reaction occurring at the time of tungsten film formation and the difference in deposition rate depending on the presence or absence of an added $H_2$ gas at the time of tungsten film formation.

FIG. 17 is a view showing the relationship between the number of ALD cycles and the deposition rate, for case (a) where the SiH$_4$ gas treatment and the WCl$_6$ gas treatment are performed and then the ALD tungsten film formation is performed with the supply of the additional H$_2$ gas (100 sccm), case (b) where the SiH$_4$ gas treatment and the WCl$_6$ gas treatment are performed and then the ALD tungsten film formation is performed without the supply of the additional H$_2$ gas, and case (c) where the ALD tungsten film formation is performed with the supply of the additional H$_2$ gas while bypassing the SiH$_4$ gas treatment and the WCl$_6$ gas treatment. In FIG. 17, the horizontal axis represents the number of ALD cycles when forming the tungsten film and the vertical axis represents the deposition rate, FIG. 18 is a view showing in detail the relationship between the number of ALD cycles and the deposition rate for cases (a), (b) and (c) mentioned above.

As shown in FIG. 17, when the SiH$_4$ gas treatment and the WCl$_6$ gas treatment are performed, the reactions of formulae (2) and (4) occur in region A corresponding to the initial stage of a film forming process, and the reaction of formula (5) occurs in region B corresponding to the stationary stage. In case (a) where the additional $H_2$ gas is also supplied at the time of forming the tungsten film with the $SiH_4$ gas treatment and the $WCl_6$ gas treatment, the reaction of formula (4) is promoted to produce $SiH_x$ so that the surface activity reduction effect cannot be sufficiently maintained. Thus, the deposition rate cannot be sufficiently reduced at the initial stage of the film forming process. In contrast, in case (b) where the additional $H_2$ gas is not supplied at the time of forming the tungsten film with the $SiH_4$ gas treatment and the $WCl_6$ gas treatment, the reaction of formula (4) is suppressed so that the surface activity reduction effect can be maintained. It is therefore possible to reduce the deposition rate at the initial stage of the film forming process. In case (c) where the $SiH_4$ gas treatment and the $WCl_6$ gas treatment are not performed, the reactions of formulae (2) to (4) do not occur. Thus, the surface activity does not rise at the initial stage of the film forming process. The deposition rate in the state of supply of the additional $H_2$ gas shows an appropriate value from the initial stage.

Figure 18:
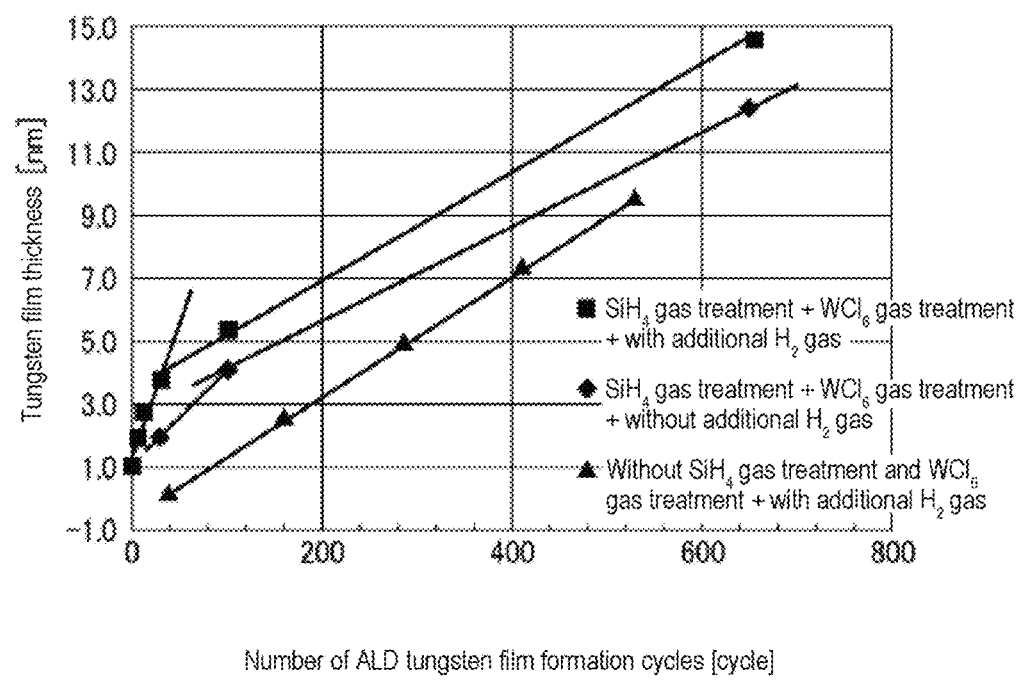
FIG. 18 is a view showing the difference in deposition rate depending on the presence or absence of an added $H_2$ gas at the time of tungsten film formation.

When calculated from FIG. 18, a deposition rate at the initial stage of the film forming process was 0.09 nm/cycle in case (a) where the additional $H_2$ gas is also supplied at the time of forming the tungsten film with the $SiH_4$ gas treatment and the $WCl_6$ gas treatment. This deposition rate in case (a) was reduced in a small amount from 0.12 nm/cycle available when only the $SiH_4$ gas treatment is performed without performing the $WCl_6$ gas treatment. In contrast, the deposition rate at the initial stage of the film forming process was 0.03 nm/cycle in case (b) where the additional $H_2$ gas is not supplied at the time of forming the tungsten film with the $SiH_4$ gas treatment and the $WCl_6$ gas treatment. This deposition rate in case (b) was a value close to 0.02 nm/cycle available in case (c) where the additional $H_2$ gas is supplied at the time of forming the tungsten film without the $SiH_4$ gas treatment and the $WCl_6$ gas treatment.

Even in the present embodiment, similar to the first embodiment, $WCl_5$ and $WCl_4$ may be used as the tungsten chloride gas at the time of a film forming process. The same gas as in the first embodiment may be used as the reducing gas. Instead of the $WCl_6$ gas treatment, a treatment using another tungsten chloride gas such as a $WCl_5$ gas, a $WCl_4$ gas or the like may be performed.

Even in the present embodiment, the formation of the tungsten film may be performed in two stages in such a way that a first tungsten film is formed in a state in which the supply amount of the $WCl_6$ gas is kept relatively small at the initial stage of the film forming process and subsequently, a second tungsten film as a main film is formed in a state in which the supply amount of the $WCl_6$ gas is raised up to a required amount.

Next, a specific sequence of the second embodiment will be described.

Similar to the first embodiment, the wafer W having the base film 202 formed on the insulating film 201 is loaded into the chamber 1 through the loading/unloading gate 11 and is placed on the susceptor 2 heated to a predetermined temperature by the heater 21. The susceptor 2 is moved up to the process position. The interior of the chamber 1 is evacuated to a predetermined vacuum degree. The opening/closing valves 104, 95a, 95b and 99 are closed and the opening/closing valves 102, 103, 96a and 96b are opened. The interior of the film-forming material tank 91 is similarly evacuated through the Evac pipe 101.

Figure 19:
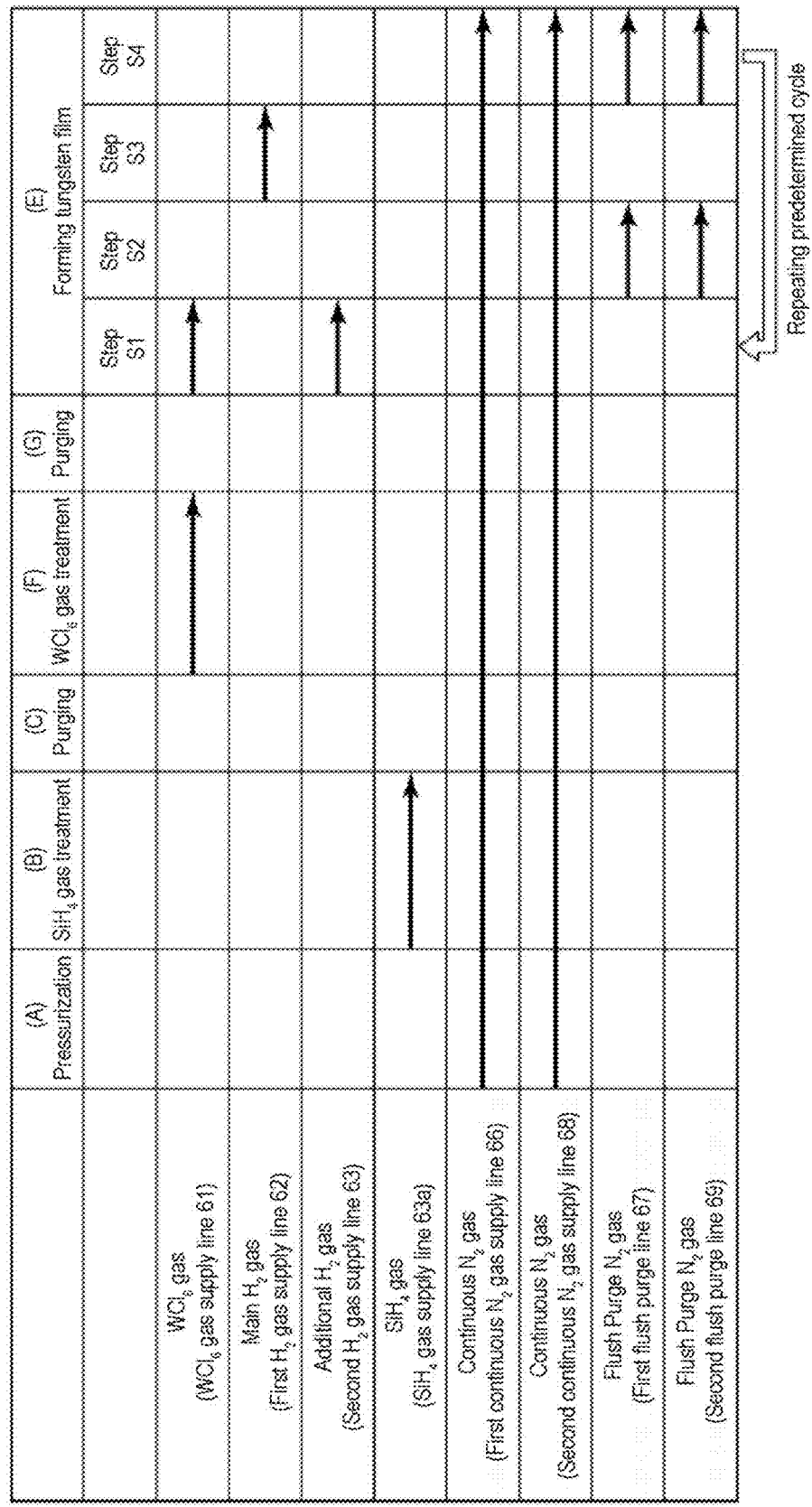
FIG. 19 is a view showing a specific sequence example in the second embodiment, in which case the added $H_2$ gas is used during a tungsten film formation.

In this state, the tungsten film forming method of the present embodiment is performed by a gas supply sequence as illustrated in FIG. 19 or 20.

In the present embodiment, as in the first embodiment, (A) raise in pressure, (B) $SiH_4$ gas treatment and (C) purging are performed. Thereafter, while keeping the opening/closing valves 76 and 78 opened, the $N_2$ gas is continuously supplied from the first $N_2$ gas supply source 54 and the second $N_2$ gas supply source 55 via the first continuous $N_2$ gas supply line 66 and the second continuous $N_2$ gas supply line 68. Furthermore, by opening the opening/closing valve 73, the $WCl_6$ gas is supplied from the $WCl_6$ gas supply mechanism 51 into the process space 37 of the chamber 1 via the $WCl_6$ gas supply line 61 to perform the $WCl_6$ gas treatment. The supply of the $WCl_6$ gas may be performed continuously. Alternatively, the supply of the $WCl_6$ gas may be performed intermittently (in a pulsed form) by operating the opening/closing valve 73.

Thereafter, the opening/closing valve 73 is closed to stop the supply of the $WCl_6$ gas. The interior of the chamber 1 is evacuated. The $N_2$ gas is continuously supplied from the first continuous $N_2$ gas supply line 66 and the second continuous $N_2$ gas supply line 68 to purge the interior of the chamber ((G) purging).

Thereafter, in the sequence of FIG. 19, (E) tungsten film formation is performed in the same manner as in the first embodiment. On the other hand, in the sequence of FIG. 20, in step S1, (E') tungsten film formation is performed in the same manner as in (E) except that the opening/closing valve 75 is closed to stop the supply of the additional $H_2$ gas.

In either sequence, after completion of the tungsten film formation of (E) or (E'), the internal pressure of the chamber 1 is made equal to the external pressure. The gate valve 12 is opened and the processed wafer W is unloaded from the chamber 1 by a transfer device (not shown).

<Processing Conditions>

An example of processing conditions is described below.

In the present embodiment, the $SiH_4$ gas treatment and the tungsten film formation are performed under the same conditions as in the first embodiment. Even when the additional $H_2$ gas is not supplied at the time of forming the tungsten film, other conditions remain the same.

The conditions of the $WCl_6$ gas treatment are as follows.

Pressure: 5 to 50 Torr (666.5 to 6,665 Pa)
Temperature: 300 degrees C. or higher (specifically 450 to 600 degrees C.)
Flow rate of $WCl_6$ gas: 3 to 60 sccm (mL/min)
Flow rate of continuously supplied $N_2$ gas: 100 to 1,400 sccm (mL/min)
Supply time period at the time of continuous supply: time period to reach saturation (self-limit) or longer*
Supply time period at the time of intermittent supply (per one cycle): 0.1 to 1 sec
Number of supply times at the time of intermittent supply: number of times to reach saturation (self-limit) or more*
*Time period (number of times) to reach saturation (self-limit) varies depending on the flow rate of the $WCl_6$ gas.

In the present embodiment, there has been illustrated an example in which when the $WCl_6$ gas treatment is performed or when the $WCl_6$ gas is supplied in the tungsten film formation together with the $WCl_6$ gas treatment, the presence of the $H_2$ gas as a reducing gas is suppressed as much as possible by stopping the supply of the additional $H_2$ gas.

However, only the stop of supply of the additional $H_2$ gas may be performed without performing the $WCl_6$ gas treatment.

<Other Application>

Although the embodiments of the present disclosure have been described above, the present disclosure is not limited to the above-described embodiments but may be variously modified. For example, in the above-described embodiments, there has been described an example in which a semiconductor wafer is used as a target substrate. However, the semiconductor wafer may be a silicon wafer or a compound semiconductor made of GaAs, SiC, GaN or the like. Furthermore, the present disclosure is not limited to the semiconductor wafer but may be applied to a glass substrate used for an FPD (flat panel display) such as a liquid crystal display device or the like, a ceramic substrate, and so forth.

According to the present disclosure in some embodiments, a base film is subjected to an $SiH_4$ gas treatment prior to forming a tungsten film. Therefore, it is possible to suppress reaction between a tungsten chloride gas and the base film at the time of forming the tungsten film and to suppress etching of the base film. In addition, it is possible to reduce resistance of the tungsten film through the $SiH_4$ gas treatment and to suppress line collapse.

Moreover, it is possible to further improve an embedding property by performing at least one of a tungsten chloride gas treatment after the $SiH_4$ gas treatment and a process of suppressing the presence of the reducing gas at the time of supplying the tungsten chloride gas in the formation process of the tungsten film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, the method comprising:

prior to supplying the tungsten chloride gas into the chamber, performing an $SiH_4$ gas treatment with respect to the target substrate having the base film formed thereon by supplying only an $SiH_4$ gas and an $N_2$ gas into the chamber for a predetermined time;

after the lapse of the predetermined time, terminating the $SiH_4$ gas treatment and then supplying only the $N_2$ gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas.

2. A tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, the method comprising:

prior to supplying the tungsten chloride gas into the chamber, performing an $SiH_4$ gas treatment with respect to the target substrate having the base film formed thereon by supplying only an $SiH_4$ gas and an $N_2$ gas into the chamber for a predetermined time;

after the lapse of the predetermined time, terminating the $SiH_4$ gas treatment and then supplying only the $N_2$ gas into the chamber;

subsequently, performing a tungsten chloride gas treatment with respect to the target substrate subjected to the $SiH_4$ gas treatment by supplying the tungsten chloride gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas.

3. The method of claim 2, wherein the $SiH_4$ gas is adsorbed onto the base film by the $SiH_4$ gas treatment, the adsorbed $SiH_4$ gas and the tungsten chloride gas are caused to react with each other by the tungsten chloride gas treatment, and a layer having a lower surface activity than the $SiH_4$ gas is formed such that the reaction is saturated at a predetermined film thickness.

4. The method of claim 2, wherein in the forming the tungsten film, the presence of the reducing gas is suppressed when supplying the tungsten chloride gas.

5. The method of claim 4, wherein in the forming the tungsten film, the reducing gas is not added when supplying the tungsten chloride gas.

6. The method of claim 2, wherein the act of performing the tungsten chloride gas treatment is performed using a $WCl_6$ gas.

7. The method of claim 6, wherein the performing a tungsten chloride gas treatment is performed in a state in which a temperature of the target substrate is 300 degrees C. or higher and a pressure or a partial pressure of the $WCl_6$ gas falls within a range of 0.1 to 1Torr.

8. A tungsten film forming method for forming a tungsten film on a target substrate disposed inside a chamber kept under a depressurized atmosphere and having a base film formed on a surface thereof, using a tungsten chloride gas as a tungsten raw material gas and a reducing gas for reducing the tungsten chloride gas, the method comprising:

prior to supplying the tungsten chloride gas into the chamber, performing a $SiH_4$ gas treatment with respect to the target substrate having the base film formed thereon by supplying only an $SiH_4$ gas and an $N_2$ gas into the chamber for a predetermined time;

after the lapse of the predetermined time, terminating the $SiH_4$ gas treatment and then supplying only the $N_2$ gas into the chamber; and subsequently, forming the tungsten film by sequentially supplying the tungsten chloride gas and the reducing gas into the chamber while purging an interior of the chamber in the course of sequentially supplying the tungsten chloride gas and the reducing gas, wherein in the forming the tungsten film, the presence of the reducing gas is suppressed when supplying the tungsten chloride gas.

9. The method of claim 8, wherein in the forming the tungsten film, the reducing gas is not added when supplying the tungsten chloride gas.

10. The method of claim 1, wherein the $SiH_4$ gas is adsorbed onto the base film by the $SiH_4$ gas treatment.

11. The method of claim 1, wherein the performing an $SiH_4$ gas treatment is performed in a state in which a temperature of the target substrate is 300 degrees C. or higher and a pressure or a partial pressure of the $SiH_4$ gas falls within a range of 0.1 to 3 Torr.

12. The method of claim 1, wherein the forming the tungsten film is performed in a state in which a temperature of the target substrate is 300 degrees C. or higher and an internal pressure of the chamber is 5 Torr or higher.

13. The method of claim 1, wherein the forming the tungsten film is performed by forming a first tungsten film with a relatively small supply amount of the tungsten chloride gas at an initial film formation stage and subsequently, forming a second tungsten film as a main film with a relatively large supply amount of the tungsten chloride gas.

14. The method of claim 1, wherein the tungsten chloride used in the forming the tungsten film is one of $WCl_6$, $WCl_5$ and $WCl_4$.

15. The method of claim 1, wherein the reducing gas is at least one of an $H_2$ gas, an $SiH_4$ gas, a $B_2H_6$ gas and an $NH_3$ gas.

16. The method of claim 1, wherein the base film includes a titanium-based material film or a tungsten compound film.

17. The method of claim 16, wherein the base film is a TiN film.

18. A non-transitory computer-readable storage medium operating on a computer and storing a program for controlling a film forming apparatus,
wherein the program, when executed, causes the computer to control the film forming apparatus so as to perform the tungsten film forming method of claim 1.

* * * * *